United States Patent
Tong et al.

(10) Patent No.: US 9,331,149 B2
(45) Date of Patent: May 3, 2016

(54) METHOD FOR LOW TEMPERATURE BONDING AND BONDED STRUCTURE

(71) Applicant: Ziptronix, Inc., Raleigh, NC (US)

(72) Inventors: Qin-Yi Tong, Durham, NC (US); Gaius Gillman Fountain, Jr., Youngsville, NC (US); Paul M. Enquist, Cary, NC (US)

(73) Assignee: ZIPTRONIX, INC., Morrisville, NC (US)

( * ) Notice: Subject to any disclaimer, the term of this patent is extended or adjusted under 35 U.S.C. 154(b) by 0 days.

(21) Appl. No.: 14/754,111

(22) Filed: Jun. 29, 2015

(65) Prior Publication Data

US 2015/0303263 A1 Oct. 22, 2015

Related U.S. Application Data

(60) Division of application No. 14/197,070, filed on Mar. 4, 2014, now Pat. No. 9,082,627, which is a division of application No. 13/341,273, filed on Dec. 30, 2011, now abandoned, which is a continuation of application (Continued)

(51) Int. Cl.
*H01L 21/30* (2006.01)
*H01L 21/46* (2006.01)
(Continued)

(52) U.S. Cl.
CPC ............ *H01L 29/16* (2013.01); *H01L 21/0206* (2013.01); *H01L 21/2007* (2013.01);
(Continued)

(58) Field of Classification Search
CPC ............ H01L 21/02032; H01L 21/187; H01L 21/2007; H01L 21/2022; H01L 21/26506; H01L 21/3065; H01L 21/3226; H01L 21/324; H01L 21/38; H01L 21/67092; H01L 21/76251

USPC .......... 257/459, 676, 684, 701, 702, E21.088, 257/E21.122, E21.215, E21.218, E21.219, 257/E21.224, E21.243, E21.245, E21.249, 257/E21.33, E23.02, E23.04

See application file for complete search history.

(56) References Cited

U.S. PATENT DOCUMENTS 3,423,823 A 1/1969 Ansley
3,488,834 A 1/1970 Baird
(Continued)

FOREIGN PATENT DOCUMENTS

CA 2 399 282 A1 8/2001
EP 0209173 A 1/1987
(Continued)

OTHER PUBLICATIONS

Nakanishi et al, "Studies on SiO2—SiO2 bonding with hydrofluoric acid—Room temperature and Low stress bondign technique for MEMS—", 1998, IEEE, pp. 609-614.

(Continued)

*Primary Examiner* — Mohammad Islam
*Assistant Examiner* — Joannie A Garcia
(74) *Attorney, Agent, or Firm* — Knobbe, Martens, Olson & Bear LLP

(57) ABSTRACT

A method for bonding at low or room temperature includes steps of surface cleaning and activation by cleaning or etching. The method may also include removing by-products of interface polymerization to prevent a reverse polymerization reaction to allow room temperature chemical bonding of materials such as silicon, silicon nitride and $SiO_2$. The surfaces to be bonded are polished to a high degree of smoothness and planarity. VSE may use reactive ion etching or wet etching to slightly etch the surfaces being bonded. The surface roughness and planarity are not degraded and may be enhanced by the VSE process. The etched surfaces may be rinsed in solutions such as ammonium hydroxide or ammonium fluoride to promote the formation of desired bonding species on the surfaces.

60 Claims, 9 Drawing Sheets

Related U.S. Application Data

No. 12/954,740, filed on Nov. 26, 2010, now Pat. No. 8,153,505, which is a continuation of application No. 12/720,368, filed on Mar. 9, 2010, now Pat. No. 7,871,898, which is a continuation of application No. 11/980,664, filed on Oct. 31, 2007, now Pat. No. 7,807,549, which is a continuation of application No. 10/913,441, filed on Aug. 9, 2004, now Pat. No. 7,387,944, which is a continuation of application No. 09/505,283, filed on Feb. 16, 2000, now Pat. No. 6,902,987.

(51) Int. Cl.

| | | |
|---|---|---|
| *H01L 29/16* | (2006.01) | |
| *H01L 21/02* | (2006.01) | |
| *H01L 21/20* | (2006.01) | |
| *H01L 21/311* | (2006.01) | |
| *H01L 21/762* | (2006.01) | |
| *H01L 23/00* | (2006.01) | |
| *H01L 29/06* | (2006.01) | |
| *H01L 21/322* | (2006.01) | |
| *H01L 27/085* | (2006.01) | |

(52) U.S. Cl.
CPC .... *H01L21/31105* (2013.01); *H01L 21/31116* (2013.01); *H01L 21/322* (2013.01); *H01L 21/76251* (2013.01); *H01L 24/26* (2013.01); *H01L 24/75* (2013.01); *H01L 24/83* (2013.01); *H01L 27/085* (2013.01); *H01L 29/06* (2013.01); *H01L 2224/8319* (2013.01); *H01L 2224/8385* (2013.01); *H01L 2224/83894* (2013.01); *H01L 2924/0102* (2013.01); *H01L 2924/01005* (2013.01); *H01L 2924/0106* (2013.01); *H01L 2924/01006* (2013.01); *H01L 2924/01013* (2013.01); *H01L 2924/01018* (2013.01); *H01L 2924/01023* (2013.01); *H01L 2924/0132* (2013.01); *H01L 2924/01033* (2013.01); *H01L 2924/01039* (2013.01); *H01L 2924/01061* (2013.01); *H01L 2924/01072* (2013.01); *H01L 2924/01074* (2013.01); *H01L 2924/01075* (2013.01); *H01L 2924/01084* (2013.01); *H01L 2924/01093* (2013.01); *H01L 2924/07802* (2013.01); *H01L 2924/10329* (2013.01); *H01L 2924/14* (2013.01); *Y10S 148/012* (2013.01); *Y10S 438/974* (2013.01); *Y10T 156/10* (2015.01); *Y10T 156/1043* (2015.01)

(56) References Cited

U.S. PATENT DOCUMENTS

| | | | |
|---|---|---|---|
| 3,508,980 A | 4/1970 | Jackson, Jr. et al. | |
| 3,534,467 A | 10/1970 | Sachs et al. | |
| 3,579,391 A | 5/1971 | Buie | |
| 3,587,166 A | 6/1971 | Alexander et al. | |
| 3,602,981 A | 9/1971 | Kooi | |
| 3,607,466 A | 9/1971 | Miyazaki | |
| 3,640,807 A | 2/1972 | Van Dijk | |
| 3,647,581 A | 3/1972 | Mash | |
| 3,888,708 A | 6/1975 | Wise et al. | |
| 4,416,054 A | 11/1983 | Thomas et al. | |
| 4,612,083 A | 9/1986 | Yasumoto et al. | |
| 4,617,160 A | 10/1986 | Belanger et al. | |
| 4,649,630 A | 3/1987 | Boland et al. | |
| 4,700,466 A * | 10/1987 | Nakagawa ............ | H01L 21/187 148/33.5 |
| 4,754,544 A | 7/1988 | Hanak | |
| 4,829,018 A | 5/1989 | Wahlstrom | |
| 4,935,386 A | 6/1990 | Nakagawa | |
| 4,939,101 A | 7/1990 | Black et al. | |
| 4,962,879 A | 10/1990 | Goesele et al. | |
| 4,963,505 A | 10/1990 | Fujii et al. | |
| 4,970,175 A | 11/1990 | Haisma et al. | |
| 4,978,421 A | 12/1990 | Bassous et al. | |
| 4,983,251 A | 1/1991 | Haisma et al. | |
| 4,992,847 A | 2/1991 | Tuckerman | |
| 5,007,071 A | 4/1991 | Nakano | |
| 5,013,471 A | 5/1991 | Ogawa | |
| 5,024,723 A | 6/1991 | Goesele et al. | |
| 5,034,343 A | 7/1991 | Rouse et al. | |
| 5,070,026 A | 12/1991 | Greenwald et al. | |
| 5,071,792 A | 12/1991 | Van Vonno et al. | |
| 5,081,061 A | 1/1992 | Rouse et al. | |
| 5,087,585 A | 2/1992 | Hayashi | |
| 5,089,431 A | 2/1992 | Slatter et al. | |
| 5,121,706 A | 6/1992 | Nichols et al. | |
| 5,162,251 A | 11/1992 | Poole et al. | |
| 5,183,783 A | 2/1993 | Ohta et al. | |
| 5,196,375 A | 3/1993 | Hoshi | |
| 5,207,864 A | 5/1993 | Bhat et al. | |
| 5,234,860 A | 8/1993 | Gluck | |
| 5,236,118 A | 8/1993 | Bower et al. | |
| 5,238,875 A | 8/1993 | Ogino | |
| 5,266,511 A | 11/1993 | Takao | |
| 5,266,824 A | 11/1993 | Abe | |
| 5,270,259 A | 12/1993 | Ito et al. | |
| 5,270,261 A | 12/1993 | Bertin et al. | |
| 5,272,104 A | 12/1993 | Schrantz et al. | |
| 5,284,707 A | 2/1994 | Ogawa et al. | |
| 5,321,301 A | 6/1994 | Sato et al. | |
| 5,324,566 A | 6/1994 | Ogawa et al. | |
| 5,324,687 A | 6/1994 | Wojnarowski | |
| 5,354,695 A | 10/1994 | Leedy | |
| 5,362,659 A | 11/1994 | Cartagena | |
| 5,376,579 A | 12/1994 | Annamalai | |
| 5,380,681 A | 1/1995 | Hsu | |
| 5,383,993 A | 1/1995 | Katada et al. | |
| 5,407,856 A | 4/1995 | Quenzer et al. | |
| 5,413,955 A | 5/1995 | Lee et al. | |
| 5,420,449 A | 5/1995 | Oji | |
| 5,421,953 A | 6/1995 | Nagakubo et al. | |
| 5,422,302 A | 6/1995 | Yonehara | |
| 5,427,638 A | 6/1995 | Goetz et al. | |
| 5,432,729 A | 7/1995 | Carson et al. | |
| 5,437,894 A | 8/1995 | Ogawa et al. | |
| 5,441,591 A | 8/1995 | Imthurn et al. | |
| 5,441,911 A | 8/1995 | Malhi | |
| 5,451,547 A | 9/1995 | Himi et al. | |
| 5,459,104 A | 10/1995 | Sakai | |
| 5,460,659 A | 10/1995 | Krut | |
| 5,485,540 A | 1/1996 | Eda | |
| 5,489,554 A | 2/1996 | Gates | |
| 5,497,033 A | 3/1996 | Fillion et al. | |
| 5,503,704 A | 4/1996 | Bower et al. | |
| 5,514,235 A | 5/1996 | Mitani et al. | |
| 5,516,727 A | 5/1996 | Broom | |
| 5,517,754 A | 5/1996 | Beilstein, Jr. et al. | |
| 5,523,602 A | 6/1996 | Horiuchi | |
| 5,534,465 A | 7/1996 | Frye et al. | |
| 5,543,648 A | 8/1996 | Miyawaki | |
| 5,546,494 A | 8/1996 | Eda | |
| 5,547,896 A | 8/1996 | Linn et al. | |
| 5,548,178 A | 8/1996 | Eda et al. | |
| 5,561,303 A | 10/1996 | Schrantz et al. | |
| 5,563,084 A | 10/1996 | Ramm et al. | |
| 5,567,657 A | 10/1996 | Wojnarowski et al. | |
| 5,569,620 A | 10/1996 | Linn et al. | |
| 5,580,407 A | 12/1996 | Haisma et al. | |
| 5,591,678 A | 1/1997 | Bendik et al. | |
| 5,627,106 A | 5/1997 | Hsu | |
| 5,647,932 A | 7/1997 | Taguchi et al. | |
| 5,650,353 A | 7/1997 | Yoshizawa et al. | |
| 5,652,436 A | 7/1997 | Stoner et al. | |
| 5,653,019 A | 8/1997 | Bernhardt et al. | |
| 5,659,192 A | 8/1997 | Sarma et al. | |
| 5,661,316 A | 8/1997 | Kish, Jr. et al. | |
| 5,661,901 A | 9/1997 | King | |
| 5,666,706 A | 9/1997 | Tomita et al. | |
| 5,668,057 A | 9/1997 | Eda et al. | |

(56) References Cited

U.S. PATENT DOCUMENTS

| | | |
|---|---|---|
| 5,672,240 A | 9/1997 | Stoner et al. |
| 5,673,478 A | 10/1997 | Beene et al. |
| 5,698,471 A | 12/1997 | Namba et al. |
| 5,741,733 A | 4/1998 | Bertagnolli et al. |
| 5,747,857 A | 5/1998 | Eda et al. |
| 5,753,529 A | 5/1998 | Chang et al. |
| 5,755,914 A | 5/1998 | Yonehara |
| 5,759,753 A | 6/1998 | Namba et al. |
| 5,760,478 A | 6/1998 | Bazso et al. |
| 5,763,318 A | 6/1998 | Bertin et al. |
| 5,766,984 A | 6/1998 | Ramm et al. |
| 5,771,555 A | 6/1998 | Eda et al. |
| 5,783,477 A | 7/1998 | Kish, Jr. et al. |
| 5,785,874 A | 7/1998 | Eda |
| 5,793,115 A | 8/1998 | Zavracky et al. |
| 5,804,086 A | 9/1998 | Bruel |
| 5,807,783 A | 9/1998 | Gaul et al. |
| 5,821,665 A | 10/1998 | Onishi et al. |
| 5,841,197 A | 11/1998 | Adamic, Jr. |
| 5,849,627 A | 12/1998 | Linn et al. |
| 5,851,894 A | 12/1998 | Ramm |
| 5,858,876 A | 1/1999 | Chew |
| 5,866,942 A | 2/1999 | Suzuki et al. |
| 5,869,354 A | 2/1999 | Leedy |
| 5,872,025 A | 2/1999 | Cronin et al. |
| 5,876,497 A | 3/1999 | Atoji |
| 5,877,034 A | 3/1999 | Ramm et al. |
| 5,877,070 A | 3/1999 | Goesele et al. |
| 5,877,516 A | 3/1999 | Mermagen et al. |
| 5,880,010 A | 3/1999 | Davidson |
| 5,889,302 A | 3/1999 | Liu |
| 5,902,118 A | 5/1999 | Hubner |
| 5,903,018 A | 5/1999 | Shimawaki |
| 5,904,860 A | 5/1999 | Nagakubo et al. |
| 5,910,699 A | 6/1999 | Namba et al. |
| 5,915,167 A | 6/1999 | Leedy |
| 5,915,193 A | 6/1999 | Tong et al. |
| 5,920,142 A | 7/1999 | Onishi et al. |
| 5,936,280 A | 8/1999 | Liu |
| 5,966,622 A | 10/1999 | Levine et al. |
| 5,980,770 A | 11/1999 | Ramachandran et al. |
| 5,982,010 A | 11/1999 | Namba et al. |
| 5,990,472 A | 11/1999 | Rinne |
| 5,990,562 A | 11/1999 | Vallett |
| 5,991,989 A | 11/1999 | Onishi et al. |
| 6,004,865 A | 12/1999 | Horiuchi |
| 6,004,866 A | 12/1999 | Nakano et al. |
| 6,018,211 A | 1/2000 | Kanaboshi et al. |
| 6,048,752 A | 4/2000 | Linderman |
| 6,054,371 A | 4/2000 | Tsuchiaki et al. |
| 6,071,761 A | 6/2000 | Jacobs |
| 6,087,719 A | 7/2000 | Tsunashima |
| 6,087,760 A | 7/2000 | Yamaguchi et al. |
| 6,103,009 A | 8/2000 | Atoji |
| 6,120,917 A | 9/2000 | Eda |
| 6,133,640 A | 10/2000 | Leedy |
| 6,136,691 A | 10/2000 | Chen |
| 6,143,628 A | 11/2000 | Sato et al. |
| 6,146,992 A | 11/2000 | Lauterbach et al. |
| 6,153,445 A | 11/2000 | Yamazaki et al. |
| 6,153,495 A | 11/2000 | Kub et al. |
| 6,154,940 A | 12/2000 | Onishi et al. |
| 6,156,624 A | 12/2000 | Yamagata et al. |
| 6,165,817 A | 12/2000 | Akram et al. |
| 6,180,496 B1 | 1/2001 | Farrens et al. |
| 6,190,778 B1 | 2/2001 | Batz-Sohn et al. |
| 6,194,323 B1 | 2/2001 | Downey et al. |
| 6,197,663 B1 | 3/2001 | Chandross et al. |
| 6,198,159 B1 | 3/2001 | Hosoma et al. |
| 6,236,141 B1 | 5/2001 | Sato et al. |
| 6,242,324 B1 | 6/2001 | Kub |
| 6,246,068 B1 | 6/2001 | Sato et al. |
| 6,255,731 B1 | 7/2001 | Ohmi et al. |
| 6,255,899 B1 | 7/2001 | Bertin et al. |
| 6,270,202 B1 | 8/2001 | Namba et al. |
| 6,274,892 B1 | 8/2001 | Kub et al. |
| 6,284,085 B1 | 9/2001 | Gwo |
| 6,313,012 B1 | 11/2001 | Horiuchi |
| 6,316,332 B1 | 11/2001 | Lo et al. |
| 6,323,108 B1 | 11/2001 | Kub et al. |
| 6,328,796 B1 | 12/2001 | Kub |
| 6,328,841 B1 | 12/2001 | Klumpp et al. |
| 6,448,174 B1 | 9/2002 | Ramm |
| 6,500,694 B1 | 12/2002 | Enquist |
| 6,562,647 B2 | 5/2003 | Zandman et al. |
| 6,563,224 B2 | 5/2003 | Leedy |
| 6,613,678 B1 | 9/2003 | Sakaguchi et al. |
| 6,627,531 B2 | 9/2003 | Enquist |
| 6,864,585 B2 | 3/2005 | Enquist |
| 6,905,557 B2 | 6/2005 | Enquist |
| 7,037,755 B2 | 5/2006 | Enquist |
| 7,041,178 B2 | 5/2006 | Tong et al. |
| 7,126,212 B2 | 10/2006 | Enquist et al. |
| 7,335,572 B2 | 2/2008 | Tong et al. |
| 7,553,744 B2 | 6/2009 | Tong |
| 8,153,505 B2 | 4/2012 | Tong et al. |
| 2003/0057423 A1 | 3/2003 | Shimoda |
| 2006/0292744 A1 | 12/2006 | Enquist et al. |
| 2009/0263953 A1 | 10/2009 | Tong |

FOREIGN PATENT DOCUMENTS

| | | |
|---|---|---|
| EP | 0 905 767 A1 | 3/1999 |
| EP | 0 933 810 A1 | 8/1999 |
| EP | 1130647 A | 9/2001 |
| JP | 54116888 A | 9/1979 |
| JP | 54155770 A | 12/1979 |
| JP | 60167439 A | 8/1985 |
| JP | 62031138 A | 2/1987 |
| JP | 63237408 A | 10/1988 |
| JP | 63246841 A | 10/1988 |
| JP | 01259546 A | 10/1989 |
| JP | 02177435 A | 7/1990 |
| JP | 03070155 A | 3/1991 |
| JP | 03101128 A | 4/1991 |
| JP | 6302486 | 10/1994 |
| JP | H08-195334 | 7/1996 |
| JP | 8-213548 | 8/1996 |
| JP | 10-92702 | 4/1998 |
| JP | 10-92702 A | 4/1998 |
| JP | 10-223495 | 8/1998 |
| JP | 11-335631 | 12/1999 |
| JP | 2006-517344 A | 7/2006 |
| JP | 2008-535230 A | 8/2008 |
| KR | 1999-0083518 | 4/1999 |
| TW | 389965 B | 5/2000 |
| WO | WO 9613060 A | 5/1996 |
| WO | WO 9813860 | 4/1998 |
| WO | WO 9845130 A | 10/1998 |
| WO | WO 99/46809 | 9/1999 |
| WO | WO 0126137 A | 4/2001 |
| WO | WO0161743 | 8/2001 |
| WO | WO 2004/071700 A2 | 8/2004 |
| WO | WO 2006/111533 A1 | 10/2006 |

OTHER PUBLICATIONS

Takai et al, "Wafer-scale room-temperature bonding between silicon and ceramic wafers by means of aroon-beam surface activation", 2001, IEEE, pp. 60-63.

Takagi et al, "Room temperature silicon wafer direct bonding in vacuum by Ar beam irradiation", 1997, IEEE, pp. 191-196.

Itoh et al, "Room temperature vacuum sealing surface activated bonding method", Jun. 8-12, 2003, IEEE, pp. 1828-1831.

"Smart Cut: A Promising New SOI Material Technology", M. Bruel et al; Proceedings 1995 IEEE Int'l SOI Conference, Oct. 1995, pp. 178-179.

"Silicon-on-Insulator Wafer Bonding—Wafer Thinning"; J. Haisma et al., Japanese J. Appl. Phys., vol. 28, No. 8, pp. 1426-1443; 1989.

EP 01 92 0489; European Search Report; Jun. 6, 2003.

J. Haisma et al.; "Silicon-on-Insulator Wafer Bonding—Wafer Thinning"; Japanese J. Appl. Phys, vol. 28, No. 8; pp. 1426-1443; 1989.

(56) References Cited

OTHER PUBLICATIONS

"Fabrication on Planar Arrays of Semiconductor Chips Separated by Insulating Barriers", IBM Technical Disclosure Bulletin, Apr. 1965, p. 1103.

Sun et al., "Cool Plasma Activated Surface in Silicon Wafer Direct Bonding Technology", Journal De Physique, pp. C4-79-C4-82, Sep. 1988.

Goetz, "Generalized Reactive Bonding", Proceedings of the 1.sup.st Semiconductor Wafer Bonding Symposium, 1991, pp. 65-73.

Zucker et al., "Application of Oxygen Plasma Processing to Silicon Direct Bonding", Sensors and Actuators A, 36 (1993), pp. 227-231.

Farrens et al., "Chemical Free Room Temperature Wafer to Wafer Direct Bonding", J. Electrochem. Soc., vol. 142, No. 11, Nov. 1995, pp. 3949-3955.

Amirfeiz et al., "Formation of Silicon Structures by Plasma Activated Wafer Bonding", Proceedings of the 5.sup.th Semiconductor Wafer Bonding Symposium, Oct. 1999, 11 pages.

Nakanishi et al., "Studies on $SiO_2$—$SiO_2$ Bonding with Hydrofluoric Acid—Room Temperature and Low Stress Bonding Techniquie for Mems—", IEEE 1998, pp. 609-614.

P. Amirfeiz, et al., The 1999 Joint International Meeting, vol. 99-2, Abstract No. 963, 1 page, "Formation of Silicon Structures by Plasma Activated Wafer Bonding," Oct. 17-22, 1999.

F.J. Kub, et al., The 1999 Joint International Meeting, vol. 99-2, Abstract No. 1031, 1 page, "A Double-Side IGBT by Low Temperature Wafer Bonding," Oct. 17-22, 1999.

S. Bengtsson, et al., International Conference on Compliant & Alternative Substrate Technology, p. 10, "Low Temperature Bonding," Sep. 1999.

S. Farrens, Electromechanical Society Proceedings, vol. 97-36, pp. 425-436, "Low Temperature Wafer Bonding," 1997.

S. Fujino, et al., Jpn. J. Appl. Phys., vol. 34, No. 10B, 1 page, "Silicon Wafer Direct Bonding Through the Amorphous Layer," Oct. 15, 1995.

U. Gosele, et al., Appl. Phys. Lett., vol. 67, No. 24, pp. 3614-3616, "Self-Propagating Room-Temperature Silicon Wafer Bonding in Ultrahigh Vacuum," Dec. 11, 1995.

G. Hess, et al., Appl. Phys. Lett., vol. 71, No. 15, pp. 2184-2186, "Evolution of Subsurface Hydrogen From Boron-Doped Si(100)," Oct. 13, 1997.

K.D. Hobart, et al., Applied Physics Letters, vol. 72, No. 9, pp. 1095-1097, "Characterization of SI pn Junctions Fabricated by Direct Wafer Bonding in Ultra-High Vacuum," Mar. 2, 1998.

H. Kim, et al., Appl. Phys. Lett., vol. 69, No. 25, pp. 3869-3871, "Effects of B Doping on Hydrogen Desorption from Si(001) During Gas-Source Molecular-Beam Epitaxy From $Si_2 H_6$ and $B_2 H_6$," Dec. 16, 1996.

Plossl, et al., Mat. Res. Soc. Symp. Proc., vol. 483, pp. 141-146, "Covalent Silicon Bonding at Room Temperature in Ultrahigh Vacuum," 1998.

B.E. Roberds, et al., Electrochemical Society Proceedings, vol. 97-36, pp. 592-597, "Wafer Bonding of GaAS, InP, and Si Annealed Without Hydrogen for Advanced Device Technologies," 1997.

B.E. Roberds, et al., Electrochemical Society Proceedings, vol. 97-36, pp. 598-606, "Low Temperature, in Situ, Plasma Activated Wafer Bonding," 1997.

H. Takagi, et al., Appl. Phys. Lett., vol. 68, No. 16, pp. 2222-2224, "Surface Activated Bonding of Silicon Wafers at Room Temperature," Apr. 15, 1996.

Q.-Y. Tong, et al., Appl. Phys. Lett., vol. 64, No. 5, pp. 625-627, "Hydrophobic Silicon Wafer Bonding," Jan. 31, 1994.

Q.Y. Tong, 9 pages, "Room Temperature Silicon and $SiO_2$ Covalent Bonding in Ambient," Dec. 10, 1999.

H. Takagi, et al., Jpn. J. Appl. Phys. vol. 28, Part 1, No. 3A, pp. 1589-1594, "Transmission Electron Microscope observations of Si/Si Interface Bonded at Room Temperature by Ar Beam Surface Activation", Mar. 1999.

T. Akatsu, et al., Journal of Applied Physics, vol. 86, No. 12, pp. 7146-7150, "GaAs Wafer Bonding by Atomic Hydrogen Surface Cleaning", Dec. 15, 1999.

L. Rayleigh, Proceedings of the Royal Society of London, Series A—Mathematical and Physical Sciences, vol. 156, pp. 326-349, "A Study of Glass Surfaces in Optical Contact", Sep. 1, 1936.

M.K. Weldon, et al., Proceedings of the Fourth International Symposium on Semiconductor Wafer Bonding: Science, Technology, and Applications, Proceedings vol. 97-36, pp. 229-248, "Mechanistic Studies of Silicon Wafer Bonding and Layer Exfoliation", (1998).

S. Schulze, et al., Proceedings of the Second International Symposium on Microstructures and Microfabricated Systems, Proceedings vol. 95-27, pp. 309-318, "Investigation of Bonded Silicon-Silicon-Interfaces Using Scanning Acoustic Microscopy", (1995).

Q.-Y. Tong, et al., 1999 IEEE International SOI Conference, pp. 104-105, "IOS—A New Type of Materials Combination for System-on-a Chip Preparation," Oct. 1999.

Yozo Kanda, et al., Sensors and Actuators, vol. A21-A23, pp. 939-943, "The Mechanism of Field-Assisted Silicon-Glass Bonding", 1990.

Jiwei Jiao, et al., Sensors and Actuators, vol. A50, pp. 117-120, "Low-Temperature Silicon Direct Bonding and Interface Behaviours", 1995.

A. Berthold, et al., Sensors and Actuators, vol. A68, pp. 410-413, "Wafer-to-Wafer Fusion Bonding of Oxidized Silicon to Silicon at Low Temperatures", 1998.

Q.-Y. Tong, et al., Electrochemical and Solid-State Letters, vol. 1, No. 1, pp. 52-53, "Low Vacuum Wafer Bonding", 1998.

Gudrun Kissinger, et al., Sensors and Actuators, vol. A36, pp. 149-156, "Void-Free Silicon-Wafer-Bond Strengthening in the 200-400EC Range", 1993.

B.M. Arora, et al., J. Vac. Sci. Technol. vol. B5, No. 4, pp. 876-882, "Reactive Ion-Etching-Induced Damage in Silicon Using $SF_6$ Gas Mixtures", Jul./Aug. 1987.

Leslie A. Field, et al., Sensors and Actuators, vol. A21-A23, pp. 935-938, "Fusing Silicon Wafers with Low Melting Temperature Glass", 1990.

Stefan Bengtsson, et al., Journal of Electronic Materials, vol. 29, No. 7, "Room Temperature Wafer Bonding of Silicon Oxidized Silicon, and Crystalline Quartz", 2000.

P. Amirfeiz, et al., Journal of the Electrochemical Society, vol. 147, No. 7, pp. 2693-2698, "Formation of Silicon Structures by Plasma-Activated Wafer Bonding", 2000.

Donato Pasquariello, et al., Journal of the Electrochemical Society, vol. 147, No. 7, pp. 2699-2703, "Oxidation and Induced Damage in Oxygen Plasma in Situ Wafer Bonding", 2000.

Donato Pasquariello, et al., Journal of the Electrochemical Society, vol. 147, No. 6, pp. 2343-2346, "Mesa-Spacers: Enabling Nondestructive Measurement of Surface Energy in Room Temperature Wafer Bonding", 2000.

M. Petzold, et al., Proceedings of the Third International Symposium on Semiconductor Wafer Bonding: Physics and Applications Proceedings vol. 95-7, pp. 380-389, "Interface Strength Characterization of Bonded Wafers", (1995).

J. Bagdahn, et al., Proceedings of the Fourth International Symposium on Semiconductor Wafer Bonding: Science, Technology, and Applications, Proceedings vol. 97-36, pp. 291-298, "Characterization of Directly Bonded Silicon Wafers by Means of the Double Cantilever Crack Opening Method", (1998).

A. Plossl, et al., Materials Science & Engineering, vol. R 25, Nos. 1-2, pp. 1-88, "Wafer Direct Bonding: Tailoring Adhesion Between Brittle Materials", Mar. 10, 1999.

Tadahiro Ohmi, et al., Proceedings Fifth International IEEE VLSI Multilevel Interconnection Conference, pp. 261-267, "VLSI Interconnects for Ultra High Speed Signal Propagation", Jun. 13-14, 1988.

William Liu, et al., IEEE Transactions on Electron Devices, vol. 40, No. 11, pp. 1917-1927, "Current Gain Collapse in Mircowave Multifinger Heterojunction Bipolar Transistors Operated at Very High Power Densities", Nov. 1993.

Q-Y. Tong, et al., MRS Bulletin, pp. 40-44, "Beyond "Smart-Cut. RTM.": Recent Advances in Layer Transfer for Material Integration", Dec. 1998.

Jan Haisma, Philips Journal of Research, vol. 49, No. ½, pp. 165-170, "Direct Bonding in Patent Literature", 1995.

(56) References Cited

OTHER PUBLICATIONS

G.A.C.M. Spierings, et al., Philips Journal of Research, vol. 49, No. ½, pp. 47-63, "Surface-Related Phenomena in the Direct Bonding of Silicon and Fused-Silica Wafer Pairs", 1995.

Peter P. Gillis, et al., Journal of Applied Physics, vol. 35, No. 3 (Part I), pp. 647-658, "Double-Cantilever Cleavage Mode of Crack Propagation", Mar. 1964.

A. Kazor, et al., Appl. Phys. Lett., vol. 65, No. 12, pp. 1572-1574, "Fluorine Enhanced Oxidation of Silicon at Low Temperatures", Sep. 19, 1994.

R. Williams, et al., Journal of Applied Physics, vol. 46, No. 2, pp. 695-698, "Mobile Fluoride Ions in $SiO_2$", Feb. 1975.

S. R. Kasi, et al., Appl. Phys. Lett., vol. 58, No. 25, pp. 2975-2977, "Chemistry of Fluorine in the Oxidation of Silicon", Jun. 24, 1991.

Rochdi Messoussi, et al., Jpn. J. Appl. Phys., vol. 35, Part 1, No. 4A, pp. 1989-1992, "Improvement of Rinsing Efficiency After Sulfuric Acid Hydrogen Peroxide Mixture ($H_2 SO_4/H_2 O_2$) by HF Addition", 1996.

Ritsuo Takizawa, et al., Jpn. J. Appl. Phys., vol. 27, No. 11, pp. L2210-L2212, "Ultraclean Technique for Silicon Wafer Surfaces with $HNO_3$—HF Systems", Nov. 1998.

R. Stengl, et al., Jpn. J. Appl. Phys., vol. 29, No. 12, pp. L2311-L2314, "Bubble-Free Silicon Wafer Bonding in a Non-Cleanroom Environment", Dec. 1988.

Takao Abe, et al., Jpn. J. Appl. Phys., vol. 29, No. 12, pp. L2311-L2314, "Silicon Wafer Bonding Mechanism for Silicon-on-Insulator Structures", Dec. 1990.

W.K. Chu, et al., Physical Review B, vol. 16, No. 9, pp. 3851-3859, "Distribution of Irradiation Damage in Silicon Bombarded with Hydrogen", Nov. 1, 1977.

Yasushiro Nishioka, et al., Appl. Phys. Lett., vol. 54, No. 12, pp. 1127-1129, "Dielectric Characteristics of Fluorinated Ultradry $SiO_2$", Mar. 20, 1999.

D. Kouvatsos, et al., Appl. Phys. Lett., vol. 61, No. 7, pp. 780-782, "Silicon-Fluorine Bonding and Fluorine Profiling in $SiO_2$ Films Grown by $NF_3$-Enhanced Oxidation", Aug. 17, 1992.

T. Hochbauer, et al., Appl. Phys. Lett., vol. 75, No. 25, pp. 3938-3940, "Hydrogen Blister Depth in Boron and Hydrogen Coimplanted N-Type Silicon", Dec. 20, 1999.

Q.-Y. Tong, et al., Appl. Phys. Lett., vol. 70, No. 11, pp. 1390-1392, "Layer Splitting Process in Hydrogen-Implanted Si, Ge, SiC, and Diamond Substrates", Mar. 17, 1997.

Hideki Takagi, et al., Appl. Phys. Lett., vol. 74, No. 16, pp. 2387-2389, "Room-Temperature Bonding of Lithium Niobate and Silicon Wafers by Argon-Beam Surface Activation", Apr. 19, 1999.

M. Morita, et al., Appl. Phys. Lett., vol. 45, No. 12, pp. 1312-1314, "Fluorine-Enhanced Thermal Oxidation of Silicon in the Presence of $NF_3$", Dec. 15, 1984.

Karin Ljungberg, et al., Appl. Phys. Lett., vol. 62, No. 12, pp. 1362-1364, "Spontaneous Bonding of Hydrophobic Silicon Surfaces", Mar. 22, 1993.

Bernard S. Meyerson, et al., Appl. Phys. Lett., vol. 57, No. 10, pp. 1034-1036, "Bistable Conditions for Low-Temperature Silicon Epitaxy", Sep. 3, 1990.

Q.-Y. Tong, et al., Appl. Phys. Lett., vol. 72, No. 1, pp. 49-51, "A "Smarter-Cut" Approach to Low Temperature Silicon Layer Transfer", Jan. 5, 1998.

A. von Keudell, et al., Appl. Phys. Lett., vol. 71, No. 26, pp. 3832-3834, "Evidence for Atomic H Insertion Into Strained Si—Si Bonds in the Amorphous Hydrogenated Silicon Subsurface From in Situ Infrared Spectroscopy", Dec. 29, 1997.

John S. Judge, J. Electrochem. Soc.: Solid State Science, vol. 118, No. 11, pp. 1772-1775, "A Study of the Dissolution of $SiO_2$ in Acidic Fluoride Solutions", Nov. 1971.

Q.-Y. Tong, et al., J. Electrochem. Soc., vol. 143, No. 5, pp. 1773-1779, "A Model of Low-Temperature Wafer Bonding and its Applications", May 1996.

S. Mack, et al., J. Electrochem. Soc., vol. 144, No. 3, pp. 1106-1111, "Analysis of Bonding-Related Gas Enclosure in Micromachined Cavities Sealed by Silicon Wafer Bonding", Mar. 1997.

B. Asper, et al., Microelectronic Engineering, vol. 36, pp. 233-240, "Basic Mechanisms Involved in the Smart-Cut.RTM. Process", 1997.

Y. Albert Li, et al., Jpn. J. Appl. Phys., vol. 39, Part 1, No. 1, pp. 275-276, "Surface Roughness of Hydrogen Ion Cut Low Temperature Bonded Thin Film Layers", Jan. 2000.

Karin Ljungberg, et al., Electrochemical Society Proceedings, vol. 95-7, pp. 163-173, "Modification of Silicon Surfaces with $H_2 SO_4:H_2 O_2$ :HF and $HNO_3$ :HF for Wafer Bonding Applications", (1996).

Terry A. Michalske, et al., J. Am. Ceram. Soc., vol. 68, No. 11, pp. 586-590, "Closure and Repropagation of Healed Cracks in Silicate Glass", 1985.

P.J.H. Denteneer, et al., Physical Review B, vol. 39, No. 15, pp. 10809-10824, "Microscopic Structure of the Hydrogen—Boron Complex in Crystalline Silicon", May 15, 1989.

P. Gupta, et al., Physical Review B, vol. 37, No. 14, pp. 8234-8243, "Hydrogen Desorption Kinetics From Monohydride and Dihydride Species on Silicon Surfaces", May 15, 1988.

K. Bergman, et al., Physical Review B, vol. 37, No. 5, pp. 2770-2773, "Donor-Hydrogen Complexes in Passivated Silicon", Feb. 15, 1988.

A.H. Mahan, et al., Physical Review B., vol. 40, No. 17, pp. 12024-12027, "Characterization of Microvoids in device-quality Hydrogenated Amorphous Silicon by Small-Angle X-Ray Scattering and Infrared Measurements", Dec. 15, 1989.

M. Niwano, et al., J. Appl. Phys., vol. 71, No. 11, pp. 5646-5649, "Morphology of Hydrofluoric Acid and Ammonium Fluoride-Treated Silicon Surfaces Studied by Surface Infrared Spectroscopy", Jun. 1, 1992.

Jeffrey T. Borenstein, et al., J. Appl. Phys., vol. 73, No. 6, pp. 2751-2754, "Kinetic Model for Hydrogen Reactions in Boron-Doped Silicon", Mar. 15, 1993.

L. Lusson, et al., J. Appl. Phys., vol. 81, No. 7, pp. 3073-3080, "Hydrogen Configurations and Stability in Amorphous Sputtered Silicon", Apr. 1, 1997.

S.J. Pearton, et al., Appl. Phys. A, vol. 43, pp. 153-195, "Hydrogen in Crystalline Semiconductors", 1987.

S.A. McQuaid, et al., J. Appl. Phys., vol. 81, No. 11, pp. 7612-7618, "Passivation, Structural Modification, and Etching of Amorphous Silicon in Hydrogen Plasmas", Jun. 1, 1997.

U. Bhattacharya, et al., IEEE Electron Device Letters, vol. 16, No. 8, pp. 357-359, "Transferred Substrate Schottky-Collector Heterojunction Bipolar Transistors: First Results and Scaling Laws for High fmax", Aug. 1995.

B. Agarwal, et al., IEEE Electron Device Letters, vol. 18, No. 5, pp. 228-231, "A 227-GHz fmax Transferred-Substrate Heterojunction Bipolar Transistor", May 1997.

Q. Lee, et al., IEEE Electron Device Letters, vol. 19, No. 3, pp. 77-79, "A > 400 GHz fmax Transferred-Substrate Heterojunction Bipolar Transistor IC Technology", Mar. 1998.

Q. Lee, et al., IEEE Electron Device Letters, vol. 20, No. 8, pp. 396-398, "Submicron Transferred-Substrate Heterojunction Bipolar Transistors", Aug. 1999.

Kiyoshi Mitani, et al., Jpn. J. Appl. Phys., vol. 31, Part 1, No. 4, pp. 969-974, "A New Evaluation Method of Silicon Wafer Bonding Interfaces and Bonding Strength by KOH Etching", Apr. 1992.

Kiyoshi Mitani, et al, Jpn. J. Appl. Phys., vol. 30, No. 4, pp. 615-622, "Causes and Prevention of Temperature-Dependent Bubbles in Silicon Wafer Bonding", Apr. 1991.

R. Stengl, et al., Jpn. J. Appl. Phys., vol. 28, No. 10, pp. 1735-1741, "A Model for the Silicon Wafer Bonding Process", Oct. 1989.

Hyeokjae Lee, et al., IEDM Technical Digest, pp. 95-683, pp. 28.2.1-28.2.4, "A New Leakage Component Caused by the Interaction of Residual Stress and the Relative Position of Poly-Si Gate at Isolation Edge", Dec. 10-13, 1995.

G.A.C.M. Spierings, et al., Proceedings of the First International Symposium on Semiconductor Wafer Bonding. Science Technology, and Applications, Proceedings vol. 92-7, pp. 18-32, "Diversity and Interfacial Phenomena in Direct Bonding", (1992).

Shoji Yamahata, et al., IEEE Gallium Arsenide Integrated Circuit Symposium, Technical Digest 1995, pp. 163-166, "Over-220-GHz-$f_T$-and-$f_{max}$ InP/InGaAs Double-Heterojunction Bipolar Transistors with a New Hexagonal Shaped Emitter", Oct. 29-Nov. 1, 1995.

(56) References Cited

OTHER PUBLICATIONS

W.E. Stanchina, et al, IEEE Gallium Arsenide Integrated Circuit Symposium, Technical Digest 1995, pp. 31-34, "An InP-Based HBT FAB for High-Speed Digital, Analog, Mixed-Signal, and Optoelectronic Ics", Oct. 29-Nov. 1, 1995.
S. Nakamura, et al., IEDM Technical Digest, vol. 95, pp. 889-892, "Giga-Bit DRAM Cells with Low Capacitance and Low Resistance Bit-Lines on Buries MOSFET's and Capacitors by Using Bonded SOI Technology-Reversed-Stacked-Capacitor (RSTC) Cell-", Dec. 10-13, 1995.
J.B. Lasky, et al., IEDM Technical Digest, vol. 85, pp. 684-687, "Silicon-on-Insulator (SOI) by Bonding and Etch-Back", Dec. 1-4, 1985.
C. den Besten, et al., IEEE Micro Electro Mechanical Systems, pp. 104-109, "Polymer Bonding of Micro-Machined Silicon Structures", Feb. 4-7, 1992.
Farzad Pourahmadi, et al., IEEE Solid-State Sensor and Actuator Workshop: Technical Digest, pp. 144-147, "Variable-Flow Micro-Valve Structure Fabricated with Silicon Fusion Bonding", Jun. 4-7, 1990.
Peter Bjeletich, et al., Proceedings of the Fourth International Symposium on Semiconductor Wafer Bonding: Science, Technology, and Applications, Proceedings vol. 97-36, pp. 349-357, "Electrical Characterization of Plasma Bonded SOI", (1999).
R. Dekker, et al., IEDM Technical Digest, vol. 97, pp. 921-923, "An Ultra Low-Power RF Bipolar Technology on Glass", Dec. 7-10, 1997.
Takeshi Sunada, et al., Jpn. J. Appl. Phys., vol. 29, No. 12, pp. L2408-L2410, "The Role of Fluorine Termination in the Chemical Stability of HF-Treated Si Surfaces", Dec. 1990.
M. Yoshimaru, et al., J. Vac. Sci. Technol. A, vol. 15, No. 6, pp. 2915-2922, "Interaction Between Water and Fluorine-Doped Silicon Oxide Films Deposited by Plasma-Enhanced Chemical Vapor Deposition", Nov./Dec. 1997.
T.M. Duncan, et al., J. Appl. Phys., vol. 60, No. 1, pp. 130-136, "Study of Fluorine in Silicate Glass With$^{19}$ F Nuclear Magnetic Resonance Spectroscopy", Jul. 1, 1986.
Eliezer M. Rabinovich, et al., J. Am. Ceram. Soc., vol. 72, No. 7, pp. 1229-1232, "Retention of Fluorine in Silica Gels and Glass", 1989.
Henry Nielsen, et al., J. Electrochem. Soc.: Solid-State Science and Technology, vol. 130, No. 3, pp. 708-711, "Some Illumination on the Mechanism of $SiO_2$ Etching in HF Solutions", Mar. 1983.
Q.-Y. Tong, et al., Electronics Letters, vol. 35, No. 4, pp. 341-342, "Low Temperature InP Layer Transfer", Feb. 18, 1999.
Q.-Y. Tong, et al., Materials Chemistry and Physics, vol. 37, pp. 101-127, "Semiconductor Wafer Bonding: Recent Developments", 1994.
W.P. Maszara, et al., J. Appl. Phys., vol. 64, No. 10, pp. 4943-4950, "Bonding of Silicon Wafers for Silicon-on-Insulator", Nov. 15, 1988.
M. Bruel, Electronics Letters, vol. 31, No. 14, pp. 1201-1202, "Silicon on Insulator Material Technology", Jul. 6, 1995.
No Author, Electronics Letters, vol. 14, No. 18, pp. 593-594, "C.M. O.S. Devices Fabricated on Buried $SiO_2$ Layers Formed by Oxygen Implantation into Silicon", Aug. 31, 1978.
N.Q. Khanh, et al., J. Electrochem. Soc., vol. 142, No. 7, pp. 2425-2429, "Nondestructive Detection of Microvoids at the Interface of Direct Bonded Silicon Wafers by Scanning Infrared Microscopy", Jul. 1995.
Q.-Y. Tong, et al., Adv. Mater., vol. 11, No. 17, pp. 1409-1425, "Wafer Bonding and Layer Splitting for Microsystems", 1999.
W.P. Maszara, J. Electrochem. Soc., vol. 138, No. 1, pp. 341-347, "Silicon-on-Insulator by Wafer Bonding: a Review", Jan. 1991.
M. Grundner, et al., Appl. Phys. A, vol. 39, pp. 73-82, "Investigations on Hydrophilic and Hydrophobic Silicon (100) Wafer Surfaces by X-Ray Photoelectron and High-Resolution Electron Energy Loss-Spectroscopy", 1986.
Wen Hsiung Ko, et al., IEEE Transactions on Electron Devices, vol. ED-26, No. 12, pp. 1896-1905, "Development of a Miniature Pressure Transducer for Biomedical Applications", Dec. 1979.

George P. Imthurn, et al., J. Appl. Phys., vol. 72, No. 6, pp. 2526-2527, "Bonded Silicon-on-Sapphire Wafers and Devices", Sep. 15, 1992.
M. Shimbo, et al., J. Appl. Phys., vol. 60, No. 8, pp. 2987-2989, "Silicon-to-Silicon Direct Bonding Method", Oct. 15, 1986.
J.B. Lasky, Appl. Phys. Lett., voi. 48, No. 1, "Wafer Bonding for Silicon-on-Insulator Technologies", Jan. 6, 1986.
Darrell Hill, et al., IEEE Microwave and Guided Wave Letters, vol. 5, No. 11, pp. 373-375, "Novel HBT with Reduced Thermal Impedance", Nov. 1995.
J.F. Jensen, et al., IEEE Journal of Solid-Stated Circuits, vol. 30, No. 10, pp. 1119-1127, "A 3.2-GHz Second-Order Delta-Sigma Modulator Implemented in InP HBT Technology", Oct. 1995.
Burhan Bayraktaroglu, et al., IEEE Electron Device Letters, vol. 14, No. 10, pp. 493-495, "Very High-Power-Density CW Operation of GaAs/AlGaAs Microwave Heterojunction Bipolar Transistors", Oct. 1993.
Alex Q. Huang, IEEE Transactions on Electron Devices, vol. 43, No. 6, pp. 1029-1032, "Analysis of the Inductive Turn-Off of Double Gate MOS Controlled Thyristors", Jun. 1996.
Peter J. Wright, et al., IEEE Transactions on Electron Devices, vol. 36, No. 5, pp. 879-889, "The Effect of Fluorine in Silicon Dioxide Gate Dielectrics", May 1989.
D. Graf, et al., J. Vac. Sci. Technol., A7(3), pp. 808-813, "Reaction of Water with Hydrofluoric Acid Treated Silicon (111) and (100) Surfaces", May/Jun. 1989.
Ciarlo, Dino R., Proceedings of the Second International Symposium on Semiconductor Wafer Bonding: Science, Technology, and Applications, Proceedings vol. 93-29, pp. 313-326, "High- and Low-Temperature Bonding Techniques for Microstructures", May 1993.
Ross, R.C., et al., Journal of Non-Crystalline Solids, vol. 66, pp. 81-86, "Physical Microstructure in Device-Quality Hydrogenated Amorphous Silicon", 1984.
Ko, W.H., et al., Micromachining and Micropackaging of Transducers, pp. 41-61, "Bonding Techniques for Microsensors", 1985.
Auberton-Herve, et al., Proceedings of the Eighth International Symposium on Silicon Materials Science and Technology, Silicon Materials Science and Technology, vol. 2, Electrochemical Society Proceedings, vol. 98-1, pp. 1341-1360, "Silicon on Insulator Wafers Using the Smart Cut.RTM. Technology", 1998.
Mitani, Kiyoshi, Wafer Bonding: Studies of Interface Bubbles and Electrical Characterization, Department of Electrical Engineering, Duke University, 1991.
Q-Y. Tong et al., Semiconductor Wafer Bonding Science and Technology, John Wiley & Sons, Inc., 1999.
"Metal Oxide Circuits on Silicon Membranes", IBM Technical Disclosure Bulletin, Oct. 1979, p. 2079.
Suzuki et al., "SiN Membrane Masks for X-Ray Lithography", Journal of Vacuum Science and Technology, vol. 20, No. 2, Feb. 1982, pp. 191-194.
Trimble et al,. "Evaluation of Polycrystalline Silicon Membranes on Fused Silica for X-Ray Lithography Masks", Journal of Vacuum Science and Technology B (Microelectronics Processing Phenomena), vol. 7, No. 6, Nov./Dec. 1989, pp. 1675-1679.
Ku et al., "Low Stress Tungsten Absorber for X-Ray Masks", Microelectronic Engineering, vol. 11, No. 1-4, Apr. 1990, pp. 303-308.
"Deliberate Design for Assuring Adequate Thermal Oxide Sidewall at the Corners of Trenches", IBM Technical Disclosure Bulletin, Jul. 1991, pp. 261-262.
"Wafer Bonding With Stress-Free Trench Isolation", IBM Technical Disclosure Bulletin, Jul. 1991, pp. 304-305.
Tong, Qin-Yi, "Low Temperature Wafer Direct Bonding", IEEE 1994, Journal of Microelectromechanical Systems, vol. 3, No. 1, Mar. 1994, pp. 29-35.
Gosele, U., et al., "Semiconductor Wafer Bonding, A Flexible Approach to Materials Combinations in Microelectronics, Micromechanics and Optoelectronics", 1997 IEEE, pp. 23-32.
Takagi, Hideki, et al., "Low Temperature Direct Bonding of Silicon and Silicon Dioxide by the Surface Activation Method", Transducers 1997, 1997 Int. Conf. on Solid State Sensors and Actuators Jun. 16-19, 1997, pp. 657-660.

(56) References Cited

OTHER PUBLICATIONS

Petersen et al., "Silicon fusion bonding for pressure sensors," in Technol. Dig. IEEE Solid State Sens.& Actuators Workshop, Hilton Head, SC, 1988, pp. 144-147.
L. Di Cioccio et al., "Silicon Carbide on Insulator Formation Using the Smart Cut Process", Electronics Letters, Jun. 6, 1996, vol. 32, No. 12, pp. 1144-1147.
E. Jalaguier et al., "Transfer of 3 in GaAs Film on Silicon Substrate by Proton Implantation Process", Electronic Letters, Feb. 19, 1998, vol. 34, No. 4 pp. 408-409.
E. Jalaguier et al., Transfer of Thin InP Films onto Silicon Substrate by Proton Implantation Process, 11th Int. Conf. on Indium Phosphide and Related Materials, May 16-20, IEEE 1999, pp. 26-27.
F.J. Kub et al., "Single-Crystal Ferroelectric Microwave Capacitor Fabricated by Separation by Hydrogen Implantation", Electronics Letters, Mar. 18, 1999, vol. 35, No. 6, pp. 477-478.
B. Aspar et al., "Smart-Cut Process Usina Metallic Bonding Application to Transfer of Si, GaAs, InP thin films", Electronics Letters, Jun. 10, 1999, vol. 35, No. 12 pp. 1024-1025.
U. Goesele et al., "Wafer Bonding for Microsystems Technologies", Sensors and Actuators 74 (1999) 161-168, 1999 Elsevier Science S.A.
G. Krauter et al., "Low Temperature Silicon Direct Bonding for Application in Micromechanics: Bonding Energies for Different Combinations of Oxides", Sensors and Actuators A 70, 271-275, 1998 Elsevier Science S.A.
M.E. Grupen-Shemansky et al., "Stress in GaAs Bonded to Si", Proceedings of 1st International Symposium on Semiconductor Wafer Bonding: Science, Technology and Applications, vol. 92-7, The Electrochemical Society, Pennington, NJ, 1992, pp. 132-145.
J. Haisma, "Direct Bonding: Retrospect and Outlook", Philips Journal of Research, vol. 49, No. ½ (1995), pp. 171-177.
Sakaguchi et al., Extremely High Selective Etching of Porous Si for Single Etch-Stop Bond-and-Etch-Back Silicon-on-Insulator, Jpn. J. Appl. Phys., vol. 34 (1995), pp. 842-847.
U. Gosele et al., "Semiconductor Wafer Bonding", Annu. Rev. Mater. Sci. 1998, 28:215-41.
U. Gosele et al., "Fundamental Issues in Wafer Bonding", J. Vac, Sci. Technol. A 17(4), Jul./Aug., 1145-1152, (1999), American Vacuum Society.
Y. Zhou et al., "Electrical Properties of Wafer-Bonded GaAs/Si Heterojunctions", Appl. Phys. Lett., vol. 73, No. 16, 1998 American Institute of Physics, pp. 2337-2339.
J.F. Klem et al., "Characterization of Thin AlGaAs/InGaAS/GaAs Quantum-Well Structure Bonded Directly to $SiO_2$/Si and Glass Substrates," J. Appl. Phys., 66(1), Jul. 1989, pp. 459-462.
B. Anthony et al., "In situ Cleaning of Silicon Substrate Surfaces by Remote Plasma-Excited Hydrogen" J. Vac. Sci. Technol. B7, 621-626 (Jul./Aug. 1989), American Vacuum Society 1989.
S. V. Hattangady et al.,"In situ Cleaning of GaAs Surface Using Hydrogen Dissociated With a Remote Noble-Gas Discharge," J. Appl. Phys. 68(3), pp. 1233-1236, (Aug. 1990).
Q.-Y. Tong et al, "The Role of Surface Chemistry in Bonding of Standard Silicon Wafers," J. Electrochem, Soc., vol. 144, No. 1, pp. 384-389 (Jan. 1997).
Baumgart et al., "Evaluation of Wafer Bonding and Etch Back for Soi Technology" Philips J. Res., vol. 49, No. ½(1995) 91-124.
Y.H. Lo et al, "Wafer Bonding Technology and its Optoelectronic Applications," SPIE proc., vol. 3006, pp. 26-35, 1997.
Vanderwater et al, "High-Brightness AlGaInP Light Emitting Diodes," Proc. IEEE, vol. 85, No. 11, pp. 1752-1764, Nov. 1997.
Biermann et al., "Direct Bonding: From an Optical Technology to a Broad Research Topic" Special Issue on Direct Bonding, Philips J. Res., vol. 49, p. 1-10, 1995.
Jan Haisma et al., "Frameworks for Direct Bonding", Philips J. Res. 49 (1995) pp. 11-21.
Haisma et al., "Surface Preparation and Phenomenological Aspects of Direct Bonding", Philips J. Res. 49 (1995) pp. 23-46.
Haisma et al., "Silicon-Wafer Fabrication and (Potential) Applications of Direct-Bonded Silicon", Philips J. Res. 49 (1995) pp. 65-89.

Egloff et al., "Evaluation of Strain Sources in Bond and Etchback Silicon-on-Insulator" Philips J. Res. 49 (1995) pp. 125-138.
G.A.C.M. Spierings, et al., "Direct Bonding of Organic Polymeric Materials", Philips J. Res. 49 (1995) pp. 139-149.
Haisma et al., "Non-Silicon Applications of Direct Bonding" Philips J. Res. 49 (1995) pp. 151-163.
Haisma et al., "Diversity and Feasibility of Direct Bonding: A Survey of a Dedicated Optical Technology", Applied Optics, 33, pp. 1154-1169 (Mar. 1994).
Lehmann et al., "Bubble-Free Wafer Bonding of GaAs and InP on Silicon in a Microcleanroom", Jpn. J. Appl. Phys., 28, pp. 2141-2143 (Dec. 1989).
Maszara et al., "Role of Surface Morphology in Wafer Bonding", J. Appl. Phys. 69(1) (Jan. 1991) pp. 257-260.
Fromm et al., Interaction of Oxygen and Nitrogen With Clean Transition Metal Surfaces, Surface Science 74 (1978) pp. 259-275.
Reiche et al., "The Effect of a Plasma Pretreatment of the Si/Si Bonding Behavior", Proceedings of the Fourth International Symposium on Semiconductor Wafer Bonding: Science and Technology and Applications, the Electrochemical Society, Pennington, NJ 1998, pp. 437-444.
Michalske et al., "Closure and Repropagation of Healed Cracks in Silicate Glass," Journal of American Ceramic Society, vol. 68 pp. 586-590 (1985).
Zhu et al., "Wafer Bonding Technology and its Applications in Optoelectronic Devices and Materials," IEEE Journal of Selected Topics in Quantum Electronics, vol. 3, No. 3, Jun. 1997 pp. 927-936.
Room Temperature Silicon Wafer Direct Bonding in Vacuum by Ar Beam Irradiation by Takagi H., Maeda R., Ando Y., Suga T., Micro Electron Mechanical Systems, 1997. MEMS '97, Proceedings, IEEE., Tenth Annual International Workshop on pp. 191-196, Jan. 23-30, 1997.
Andreas Plossi et al., "The Interface of Silicon Sampled Joined at Room Temperature by Wafer Direct Bonding in Ultrahigh Vacuum", Proceedings of the Eighth International Symposium on Silicon Materials Science and Technology, vol. 2, pp. 1361-1372, 1998.
C. Gui et al, "Present and Future Role of Chemical Mechanical Polishing in Wafer Bonding", Journal of the Electrochemical Society, vol. 145, No. 6, pp. 2198-2204, Jun. 1998.
Hideki Takagi et al., "Low-Temperature Direct Bonding of Silicon and Silicon Dioxide by the Surface Activation Method", Sensors and Actuators A, vol. 70, No. 1-2, pp. 164-170, Oct. 1, 1998.
Sailer et al., Creating 3D Circuits Using Transferred Films, Circuits and Devices, IEEE 1997, Nov. 1997, pp. 27-30.
Korean Office Action issued Dec. 28, 2011, in Patent Application No. 10-2011-7015751 (with English-language translation).
Xu et al., Silicon on Quartz by Solid-State Diffusion Bonding (SSDB) Technology, Electronics Letters, 25 (May 26, 1988) 691-92.
Takashi Kurahashi et al., Sensors Utilizing Si Wafer Direct Bonding at Low Temperature, 1991 Proceedings of the 2nd International Symposium on Micro Machine and Human Science 173, 173.
Cynthia A. Desmond et al., Low-Temperature Atmospheric Silicon-Silicon Wafer Bonding for Power Electronic Applications, 97-36 Electrochemical Society Proceedings 459 (1998).
Fritz J. Kub et al., Electrical Characteristics of Low Temperature Direct Silicon-Silicon Bonding for Power Device Applications, 97-36 Electrochemical Society Proceedings 466 (1998).
Stefan Bengtsson et al., The Influence of Wafer Dimensions on the Contact Wave Velocity in Silicon Wafer Bonding, 69 Applied Physics Letters 3381 (1996).
Karin Ljungberg et al., Improved Direct Bonding of Si and SiO2 Surfaces by Cleaning in H2SO4:H2O2:HF, 67 Applied Physics Letters 650 (1995).
Q.-Y. Tong et al., Feasibility Study of VLSI Device Layer Transfer by CMP PETEOS Direct Bonding, 1996 Proceedings 1996 IEEE International SOI Conference 36.
Qin-Yi Tong et al., Transfer of Semiconductor and Oxide Films by Wafer Bonding and Layer Cutting, 29 J. Electronic Materials 928 (2000).
Q.-Y. Tong et al., Silicon Carbide Wafer Bonding, 142 J. Electrochemical Society 232 (1995).

(56) References Cited

OTHER PUBLICATIONS

Tong et al., Fabrication of Ultrathin SOI by SIMOX Wafer Bonding (SWB), Journal of Electronic Materials, vol. 22, No. 7, 1993, 763-768.
X. L. Xu et al., Novel Two-Step SDB Technology for High-Performance Thin-Film SOI/MOSFET Applications, 25 Electronics Letters 394 (1989).
Tong et al., Materials with a Buried C60 Layer Produced by Direct Wafer Bonding, J. Electrochem. Soc., vol. 141, No. 10, Oct. 1994, 137-38.
K. Henttinen et al., Mechanically Induced Si Layer Transfer in Hydrogen-Implanted Si Wafers, 76 Applied Physics Letters 2370 (2000).
Tong et al., Ultrathin single-crystalline silicon on quartz (SOQ) by 150 C wafer bonding, Sensors and Actuators A 48 (1995) 117-123.
Li et al., Low temperature direct bonding using pressure and temperature, SPIE, vol. 3184, 124-27 (1997).
Hideki Yokoi et al., Analysis of GaInAsP Surfaces by Contact-Angle Measurement for Wafer Direct Bonding with Garnet Crystals, 38 Japanese J. Applied Physics 4780 (1999).
C. Harendt et al., Vertical Polysilicon Interconnects by Aligned Wafer Bonding, 97-36 Electrochemical Society Proceedings 501 (1998).
Satoshi Matsumoto et al., Thin-Film Quasi-SOI Power MOSFET Fabricated by Reversed Silicon Wafer Direct Bonding, 45 IEEE Transactions on Electron Devices 105 (1998).
D. Bollmann et al., Three Dimensional Metallization for Vertically Integrated Circuits, 1997 Materials for Advanced Metallization MAM '97 Abstracts Booklet 94.
D.E. Booth et al., Backside Imaging CCD Using Bonded and Etched Back Silicon on Epoxy, 97-36 Electrochemical Society Proceedings 584 (1998).
Robert W. Bower et al., Low Temperature S3N4 Direct Bonding, 62 Applied Physics Letters 3485 (1993).
R.W. Bower et al., Aligned Wafer Bonding: A Key to Three Dimensional Microstructures, 20 J. Electronic Materials 383, 383 (1991).
Robert W. Bower et al., Design Considerations of a Digital Pressure Sensor Array, 1991 International Conference on Solid-State Sensors and Actuators, 1991. Digest of Technical Papers, Transducers, '91 312.
C. B. Eom et al., Fabrication of Double Sided YBa2Cu3O7 Thin Films on 2 Inch Diameter LaAlO3 Wafers by Direct Wafer Bonding, 7 IEEE Transactions on Applied Superconductivity 1244 (1997).
S. N. Farrens et al., A Kinetics Study of the Bond Strength of Direct Bonded Wafers, 141 J. Electrochemical Society 3225 (1994).
Diego Feijoó et al., Silicon Wafer Bonding Studied by Infrared Absorption Spectroscopy, 65 Applied Physics Letters 2548, 2548 (1994).
U. Gösele et al., History and Future of Semiconductor Wafer Bonding, 47-48 Solid State Phenomena 33 (1996).
K.D. Hobart et al., Fabrication of a Double-Side IGBT by Very Low Temperature Wafer Bonding, 1999 Proceedings of the 11th International Symposium on Power Semiconductor Devices and ICs 45, 46 (1999).
Qing-An Huang et al., Biased-Voltage Controlled Thinning for Bonded Silicon-On-Insulator Wafers, 66 Applied Physics Letters 2990 (1995).
M. S. Ismail et al., One-Step Direct Bonding Process of Low Temperature Si3N4 and TiN Technology, 1993 Proceedings of the 7th International Conference on Solid State Sensors and Actuators, 188 (1993).
Mohd Salleh Ismail et al., Digital Pressure-Switch Array with Aligned Silicon Fusion Bonding, 1 J. Micromechanics and Microengineering 231 (1991).
J. Köhler et al., Weibull Fracture Probability for Silicon Wafer Bond Evaluation, 147 J. Electrochemical Society 4683, 4683, 4685 (2000).
Shi-Ji Lu et al., A New Silicon Micromachining Method Using SOI/SDB Technology, 23 Sensors and Actuators 961 (1990).
David W. Oberlin, A New Air-Isolation Process for Monolithic Integrated Circuits, 17 IEEE Transactions on Electron Devices 485 (1970).

H. J. Quenzer et al., Low Temperature Wafer Bonding for Micromechanical Applications, 1992 Micro Electro Mechanical Systems, 1992, MEMS '92 49, 52.
Martin A. Schmidt, Wafer-to-Wafer Bonding for Microstructure Formation, 86 Proceedings of the IEEE 1575, 1578 (1998).
Andreas Schumacher et al., The Bonding Energies of Oxidized Silicon Wafers for Micromechanical Applications at Moderate Temperatures, 97-36 Electrochemical Society Proceedings 155 (1998).
Q.-Y. Tong et al., Diffusion and Oxide Viscous Flow Mechanism in SDB Process and Silicon Wafer Rapid Thermal Bonding, 26 Electronic Letters 697 (1990).
Q.-Y. Tong et al., Low Temperature Si Layer Splitting, 1997 Proceedings 1997 IEEE International SOI Conference 126.
Q.-Y. Tong et al., Thickness Considerations in Direct Silicon Wafer Bonding, 142 J. Electrochemical Society 3975 (1995).
V.H.C. Watt et al., Low Temperature Direct Bonding on Nonhydrophilic Surfaces, 30 Electronic Letters 693, 694 (1994).
Korean Office Action Issued Nov. 27, 2012 in Patent Application No. 10-2011-7015751 (with English translation).
Office Action issued Jan. 8, 2013 in Japanese Patent Application No. 2001-560438 (English language translation only).
Office Action issued Oct. 15, 2013 in Japanese patent Application No. 2001-560438 with English language translation.
Q-Y Tong et al., "Wafer Bonding of Si With Dissimilar Materials," pp. 524-526, (1995).
Barry E. Burke, et al., Soft-X-Ray CCD Imagers for AXAF, IEEE Transactions on Electron Devices, vol. 44, No. 10, Oct. 1997,pp. 1633-1642.
International Conference on Compliant & Alternative Substrate Technology, Meeting Program & Abstract Book, Sep. 19-23, 1999 Disney's Boardwalk Inn, Lake Buena Vista, FL total of 6 pages.
Office Action mailed on Dec. 17, 2013, in Japanese Patent Application 2012-107053 (English Translation Only).
Japanese Office Action issued May 29, 2012, in Patent Application No. 2001-560438 (with English Translation).
TSMC Answer to Second Amended Complaint, filed Aug. 27, 2012, pp. 1-80.
E. Bertagnolli, et al. Interchip Via Technology Three-Dimensional Metallization for Vertically Integrated Circuits, Electrochemical Society Proceedings, vol. 97-36, pp. 509-520, (2000).
Xu et al., Silicon on Quartz by Solid-State Diffusion Bonding (SSDB) Technology, Electronics Letters, May 26, 1988, vol. 24, No. 11 pp. 691-692.
Xu et al., Novel Two-Step SDB Technology for High-Performance Thin-Film SOI/Mosfet Applications, Electronics Letters, Mar. 16, 1989, vol. 25, No. 6 pp. 394-395.
Q.-Y. Tong et al., Feasibility Study of VLSI Device Layer Transfer by CMP PETEOS Direct Bonding, Proceedings 1996 IEEE International SOI Conference, Oct. 1996 pp. 36 and 37.
Office Action issued May 13, 2014 in Japanese Patent Application No. 2013-143038 with English language translation.
Office Action issued Aug. 19, 2014 in Japanese Patent Application No. 2012-107053 (with English language translation).
Abe et al., "Bonded SOI wafers with various substrates for IC fabrication," Proceedings of the Second International Symposium on Semiconductor Wafer Bonding: Science, Technology and Applications, The Electrochemical Society Proceedings, vol. 93-29 (1993), pp. 32-42.
Arnold, Emil, "Silicon-on-insulator devices for high voltage and power IC applications," Proceedings of the Second International Symposium on Semiconductor Wafer Bonding: Science, Technology and Applications, The Electrochemical Society Proceedings, vol. 93-29 (1993), pp. 161-175.
Beitman et al., "Bonded SOI in a bipolar IC without trench isolation," Proceedings of the Second International Symposium on Semiconductor Wafer Bonding: Science, Technology and Applications, The Electrochemical Society Proceedings, vol. 93-29 (1993), pp. 144-151.
Booth et al., "Full three dimensional microcircuit integration techniques using wafer bonding," Proceedings of the Second International Symposium on Semiconductor Wafer Bonding: Science, Technology and Applications, The Electrochemical Society Proceedings, vol. 93-29 (1993), pp. 293-302.

(56) References Cited

OTHER PUBLICATIONS

Brugger et al., "High-precision aligned silicon wafer bonding for a micromachined AFM sensor," Proceedings of the Second International Symposium on Semiconductor Wafer Bonding: Science, Technology and Applications, The Electrochemical Society Proceedings, vol. 93-29 (1993), pp. 363-372.
Cha et al., "Design considerations for wafer bonding of dissimilar materials," Proceedings of the Second International Symposium on Semiconductor Wafer Bonding: Science, Technology and Applications, The Electrochemical Society Proceedings, vol. 93-29 (1993), pp. 257-266.
Christel et al., "Silicon fusion bonding: An important tool for the design of micromechanical silicon devices," Proceedings of the Second International Symposium on Semiconductor Wafer Bonding: Science, Technology and Applications, The Electrochemical Society Proceedings, vol. 93-29 (1993), pp. 327-339.
Desmond et al., "The effects of process-induced defects on the chemical selectivity of highly-doped boron etchstops," Proceedings of the Second International Symposium on Semiconductor Wafer Bonding: Science, Technology and Applications, The Electrochemical Society Proceedings, vol. 93-29 (1993), pp. 423-432.
Eda et al., "Quartz crystal on silicon technique using direct bonding," Proceedings of the Second International Symposium on Semiconductor Wafer Bonding: Science, Technology and Applications, The Electrochemical Society Proceedings, vol. 93-29 (1993), pp. 373-381.
Esashi, "Complex micromechanical structures by low temperature bonding," Proceedings of the Second International Symposium on Semiconductor Wafer Bonding: Science, Technology and Applications, The Electrochemical Society Proceedings, vol. 93-29 (1993), pp. 348-362.
Farrens et al., "Analysis of bond characteristics in Si direct-bonded materials," Proceedings of the Second International Symposium on Semiconductor Wafer Bonding: Science, Technology and Applications, The Electrochemical Society Proceedings, vol. 93-29 (1993), pp. 81-95.
Farrens et al., "Chemical free wafer bonding of silicon to glass and sapphire," Electrochemical Society Proceedings vol. 95-7, 1995, pp. 72-77.
Feijóo et al, "BE-SOI with etch stop layers grown by RTCVD," Proceedings of the Second International Symposium on Semiconductor Wafer Bonding: Science, Technology and Applications, The Electrochemical Society Proceedings, vol. 93-29 (1993), pp. 267-279.
Feindt et al., "A complementary bipolar process on bonded wafers," Proceedings of the Second International Symposium on Semiconductor Wafer Bonding: Science, Technology and Applications, The Electrochemical Society Proceedings, vol. 93-29 (1993), pp. 189-196.
Folta et al., "Low-temperature wafer bonding of surfaces using a reactive sputtered oxide," Proceedings of the Second International Symposium on Semiconductor Wafer Bonding: Science, Technology and Applications, The Electrochemical Society Proceedings, vol. 93-29 (1993), pp. 107-113.
Gan, Qing, "Surface activation enhanced low temperature silicon wafer bonding," Dissertation submitted in partial fulfillment of the requirements for the degree of Doctor of Philosophy, Department of Mechanical Engineering and Materials Science, Duke University, Aug. 4, 2000, 192 pages.
Garofalini, Stephen H., "Atomistic structure and dynamic behavior of silica surfaces," Proceedings of the Second International Symposium on Semiconductor Wafer Bonding: Science, Technology and Applications, The Electrochemical Society Proceedings, vol. 93-29 (1993), pp. 57-70.
Gassel et al., "SIMOX and wafer bonding: Combination of competitors complements one another," Proceedings of the Second International Symposium on Semiconductor Wafer Bonding: Science, Technology and Applications, The Electrochemical Society Proceedings, vol. 93-29 (1993), pp. 433-442.
Gösele et al., "Silicon layer transfer by wafer bonding," Proceedings of the Second International Symposium on Semiconductor Wafer Bonding: Science, Technology and Applications, The Electrochemical Society Proceedings, vol. 93-29 (1993), pp. 395-409.
Harendt et al., "Bonded-wafer SOI smart power circuits in automotive applications," Proceedings of the Second International Symposium on Semiconductor Wafer Bonding: Science, Technology and Applications, The Electrochemical Society Proceedings, vol. 93-29 (1993), pp. 129-143.
Horning et al., "Wafer-to-wafer bond characterization by defect decoration etching," Proceedings of the Second International Symposium on Semiconductor Wafer Bonding: Science, Technology and Applications, The Electrochemical Society Proceedings, vol. 93-29 (1993), pp. 199-206.
Hughes, Donald L., "Silicon-silicon direct wafer bonding," Proceedings of the Second International Symposium on Semiconductor Wafer Bonding: Science, Technology and Applications, The Electrochemical Society Proceedings, vol. 93-29 (1993), pp. 17-31.
Iyer et al., "Ultra thin silicon-on insulator using epitaxial etch stops," Proceedings of the Second International Symposium on Semiconductor Wafer Bonding: Science, Technology and Applications, The Electrochemical Society Proceedings, vol. 93-29 (1993), pp. 3-16.
Jiao et al., "Silicon direct bonding at low temperature near the boiling point of water," Proceedings of the Second International Symposium on Semiconductor Wafer Bonding: Science, Technology and Applications, The Electrochemical Society Proceedings, vol. 93-29 (1993), pp. 280-282.
Kawai et al, "Structure of the interface of a bonded wafer," Proceedings of the Second International Symposium on Semiconductor Wafer Bonding: Science, Technology and Applications, The Electrochemical Society Proceedings, vol. 93-29 (1993), pp. 216-224.
Ling et al., "Influence of bonding temperature on the electrical properties of Si/SiO2 interfaces in bonded silicon-on-insulator-wafers" Proceedings of the Second International Symposium on Semiconductor Wafer Bonding: Science, Technology and Applications, The Electrochemical Society Proceedings, vol. 93-29 (1993), pp. 453-462.
Ljungberg et al., "Buried silicide layers in silicon using wafer bonding with cobalt as interfacial layer," Proceedings of the Second International Symposium on Semiconductor Wafer Bonding: Science, Technology and Applications, The Electrochemical Society Proceedings, vol. 93-29 (1993), pp. 249-256.
Ljungberg et al., "Spontaneity of hydrophobic Si—Si bonding and properties of the bonded interfaces," Proceedings of the Second International Symposium on Semiconductor Wafer Bonding: Science, Technology and Applications, The Electrochemical Society Proceedings, vol. 93-29 (1993), pp. 473-482.
Macary et al, "Influence of the wafer cleaning on the electrical properties of Si—Si bonded wafers," Proceedings of the Second International Symposium on Semiconductor Wafer Bonding: Science, Technology and Applications, The Electrochemical Society Proceedings, vol. 93-29 (1993), pp. 463-472.
McLachlan et al., "A bonded wafer bipolar process in manufacturing," Proceedings of the Second International Symposium on Semiconductor Wafer Bonding: Science, Technology and Applications, The Electrochemical Society Proceedings, vol. 93-29 (1993), pp. 43-54.
Mitani et al, "Investigation of the N-type inversion layer induced at the bottom of P-type active silicon layers in bonded SOI wafers," Proceedings of the Second International Symposium on Semiconductor Wafer Bonding: Science, Technology and Applications, The Electrochemical Society Proceedings, vol. 93-29 (1993), pp. 443-452.
Mumola et al., "Plasma-thinned silicon-on-insulator bonded wafers," Proceedings of the Second International Symposium on Semiconductor Wafer Bonding: Science, Technology and Applications, The Electrochemical Society Proceedings, vol. 93-29 (1993), pp. 410-422.
Nishizawa et al., "An advanced dielectric isolation structure for SOI-CMOS/BiCMOS.VLSIs," Proceedings of the Second International Symposium on Semiconductor Wafer Bonding: Science, Technology and Applications, The Electrochemical Society Proceedings, vol. 93-29 (1993), pp. 176-188.

(56) References Cited

OTHER PUBLICATIONS

Reiche et al., "Characterization of interfaces of directly bonded silicon wafers: A comparative study of secondary ion mass spectroscopy multiple internal reflection spectroscopy, and transmission electron microscopy," Jpn. J. Appl. Phys., vol. 35 (1996), pp. 2102-2107, Part 1, No. 4A, Apr. 1996.
Robb et al., "High temperature lateral dopant diffusion in WSi2, TiSi2 and TiN films," Proceedings of the Second International Symposium on Semiconductor Wafer Bonding: Science, Technology and Applications, The Electrochemical Society, Proceedings vol. 93-29 (1993), pp. 230-239.
Roberds et al., "Low temperature silicon direct bonding," Department of Mechanical, Aeronautical, and Materials Engineering, University of California, Davis, 1997, pp. 240-248.
Rouse et al, "Application of 150 mm bonded wafer technology to a power asic process," Proceedings of the Second International Symposium on Semiconductor Wafer Bonding: Science, Technology and Applications, The Electrochemical Society Proceedings, vol. 93-29 (1993), pp. 283-292.
Saitoh et al., "Characterization of directly bonded silicon-on-insulator structures using spectroscopic ellipsometry," Proceedings of the Second International Symposium on Semiconductor Wafer Bonding: Science, Technology and Applications, The Electrochemical Society Proceedings, vol. 93-29 (1993), pp. 207-215.
Sakakibara et al., "A wafer bonded—SOI bipolar transistor," Proceedings of the Second International Symposium on Semiconductor Wafer Bonding: Science, Technology and Applications, The Electrochemical Society Proceedings, vol. 93-29 (1993), pp. 152-160.
Shajii et al., "A backside contact technology for a wafer-bonded liquid shear-stress sensor," Proceedings of the Second International Symposium on Semiconductor Wafer Bonding: Science, Technology and Applications, The Electrochemical Society Proceedings, vol. 93-29 (1993), pp. 340-347.
Söderbärg et al., "Formation of heat sinks using bonding and etch back technique in combination with diamond deposition," Proceedings of the Second International Symposium on Semiconductor Wafer Bonding: Science, Technology and Applications, The Electrochemical Society Proceedings, vol. 93-29 (1993), pp. 382-391.
Sooriakumar et al, "Thermal mismatch strain in anodically bonded silicon and glass," Proceedings of the Second International Symposium on Semiconductor Wafer Bonding: Science, Technology and Applications, The Electrochemical Society Proceedings, vol. 93-29 (1993), pp. 225-229.
Stanley, Timothy, "Revenue sensitivity to yield and starting wafer cost in SOI SRAM production," Proceedings of the Second International Symposium on Semiconductor Wafer Bonding: Science, Technology and Applications, The Electrochemical Society Proceedings, vol. 93-29 (1993), pp. 303-309.
Suga, T., "Room-temperature bonding on metals and ceramics," Proceedings of the Second International Symposium on Semiconductor Wafer Bonding: Science, Technology and Applications, The Electrochemical Society Proceedings, vol. 93-29 (1993), pp. 71-80.
Tong et al., "Low temperature wafer direct bonding," Proceedings of the Second International Symposium on Semiconductor Wafer Bonding: Science, Technology and Applications, The Electrochemical Society Proceedings, vol. 93-29 (1993), pp. 96-106.
Weldon et al., "Physics and chemistry of silicon wafer bonding investigated by infrared absorption spectroscopy," Journal of Vacuum Science & Technology B, Jul./Aug. 1996, vol. 14, No. 4, pp. 3095-3106.
Yallup, Kevin, "Analog CMOS circuits on thick film SOI," Proceedings of the Second International Symposium on Semiconductor Wafer Bonding: Science, Technology and Applications, The Electrochemical Society Proceedings, vol. 93-29 (1993), pp. 117-128.
First Office Action (English translation) mailed Oct. 6, 2015, issued in Japanese Patent Application No. 2012-107053, 7 pages.
Amirfeiz et al., "Formation of silicon structures by plasma activated wafer bonding," Electrochemical Society Proceedings: Semiconductor Wafer Bonding: Science, Technology, and Applications V, vol. 99-35, (1999), pp. 29-39.
Amirfeiz et al., "Formation of silicon structures by plasma activated wafer bonding," vol. 99-2, Abstract No. 963, 1999 Joint Int'l Meeting of the Electrochecm. Soc'y, Dec. 16, 1999.
*Ziptronix, Inc.* v. *Omnivision Technologies*, Complaint for Patent Infringement, Case 4:10-cv-05525-SBA, Document 48, filed May 4, 2011, pp. 1-29.
*Ziptronix, Inc.* v. *Ominvision Technologies*, Defendant TSMC's Answer and Affirmative Defenses to Ziptronix First Amended Complaint, Case No. 4:10-cv-05525-SBA, Document 49, filed May 4, 2011, pp. 1-45.
*Ziptronix, Inc.* v. *Omnivision Technologies*, Complaint for Patent Infringement, Case No. 4:10-cv-05525-SBA Document 1, filed Dec. 16, 2010, pp. 1-17.
*Ziptronix, Inc.* v. *Omnvision Technologies, Inc.*, Defendants' Third Supplemental Consolidated Invalidity Contentions Under Patent Local Rule 3-3, Case No. 4:10-cv-05525-SBA, dated Jun. 14, 2013, pp. 1-5379, (submitted in multiple parts).

* cited by examiner

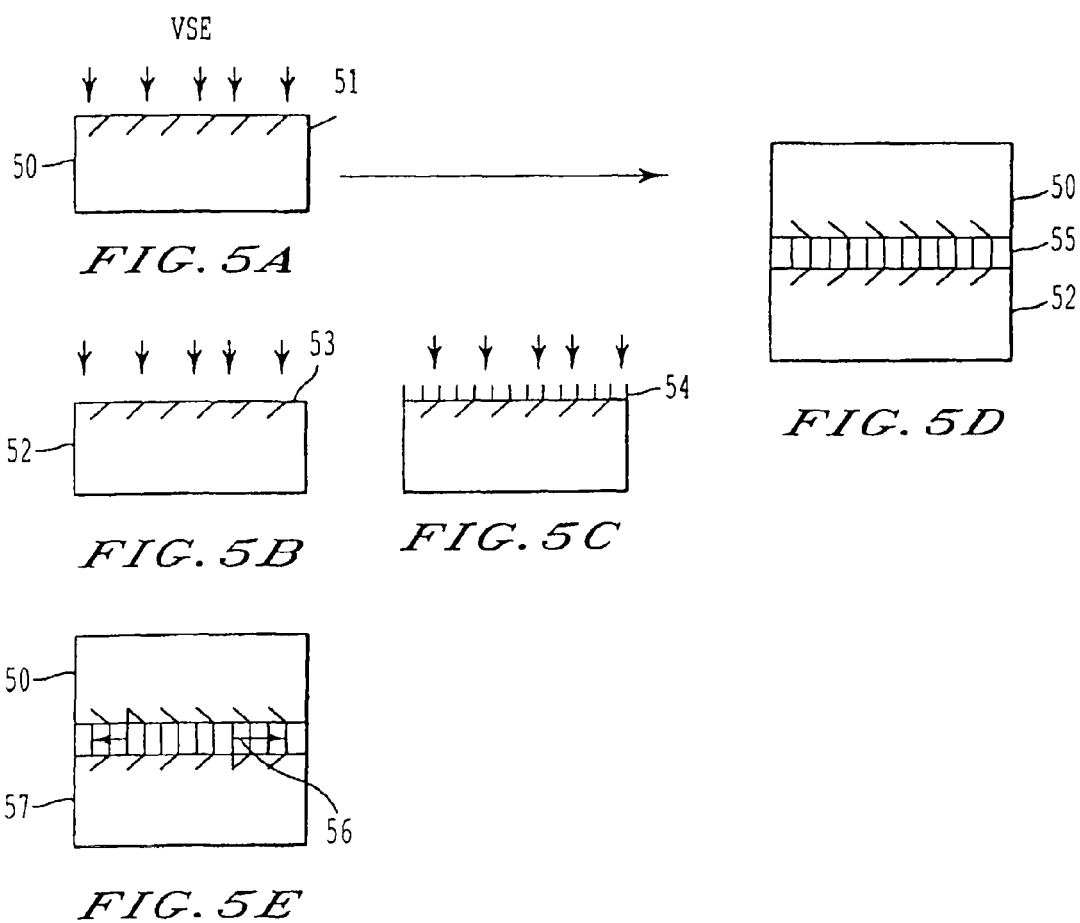

METHOD FOR LOW TEMPERATURE BONDING AND BONDED STRUCTURE

CROSS REFERENCE TO RELATED APPLICATIONS

This application is a division of, and claims the benefit of priority under 35 U.S.C. §120 from U.S. Ser. No. 14/197,070, filed Mar. 4, 2014, which is a division of U.S. Ser. No. 13/341, 273, filed Dec. 30, 2011, which is a continuation of U.S. Ser. No. 12/954,740, filed Nov. 26, 2010, now U.S. Pat. No. 8,153, 505, which is a continuation of U.S. Ser. No. 12/720,368 filed Mar. 9, 2010, now U.S. Pat. No. 7,871,898, which is a continuation of U.S. Ser. No. 11/980,664 filed Oct. 31, 2007, now U.S. Pat. No. 7,807,549, which is a continuation of U.S. Ser. No. 10/913,441 filed Aug. 9, 2004, now U.S. Pat. No. 7,387, 944, which is a continuation of U.S. Ser. No. 09/505,283, filed Feb. 16, 2000, now U.S. Pat. No. 6,902,987, the entire contents of each of which are incorporated herein by reference.

BACKGROUND OF THE INVENTION

1. Field of the Invention

The present invention relates to bonding of materials at room temperature and, in particular, to bonding of processed semiconductor materials, such as integrated circuit or device substrates, having activated surfaces to achieve high bonding strength adequate for subsequent fabrication and/or a desired application.

2. Background of the Invention

Direct room temperature bonding generally produces weak van der Waals or hydrogen bonding. Annealing is typically required to convert the weak bond to a stronger chemical bond such as a covalent bond. Other wafer bonding techniques including anodic and fusion typically require the application of voltage, pressure and/or annealing at elevated temperature to achieve a sufficient bond strength for subsequent fabrication and/or the desired application. The need to apply voltage, pressure or heat has significantly limited wafer bonding applications because these parameters can damage the materials being wafer bonded, give rise to internal stress and introduce undesirable changes in the devices or materials being bonded. Achieving a strong bond at low temperatures is also critical for bonding of thermally mismatched or thermally sensitive wafers including processed device wafers.

Ultra high vacuum (UHV) bonding is one of the approaches to achieve a low or room temperature strong bond. However, the bonding wafers still have to be pre-annealed at high temperatures, for instance >600° C. for silicon and 500° C. for GaAs, before cooling down to low or room temperature for bonding. Furthermore, the UHV approach does not generally work on commonly used materials, for example, in $SiO_2$. It is further also expensive and inefficient.

Adhesive layers can also be used to bond device wafers to a variety of substrates and to transfer device layers at low temperatures. However, thermal and chemical instability, interface bubbles, stress and the inhomogeneous nature of adhesive layers prevent its wide application. It is thus highly desirable to achieve a strong bond at room temperature by bonding wafers in ambient without any adhesive, external pressure or applied electric field.

Low vacuum bonding has been explored as a more convenient alternative to UHV bonding but a bonding energy comparable to the bulk silicon fracture energy using bonded bare silicon wafer pairs has only be achieved after annealing at ~150° C. For oxide covered silicon wafer pairs annealing at ~300° C. is required to obtain a high bond energy. It has not been possible to obtain high bonding energies in bonded material using low vacuum bonding at room temperature.

A gas plasma treatment prior to bonding in ambient is known to enhance the bonding energy of bonded silicon pairs at low or room temperature. See, for example, G. L. Sun, Q. -Y. Tong, et al., J. de Physique, 49(C4), 79 (1988); G. G. Goetz, Proc. of 1st Symp. on Semicond. Wafer Bonding: Science, Technol. and Applications, The Electrochem. Soc., 92-7, 65 (1992); S. Farrens et al., J. Electroch. Soc., 142,3950 (1995) and Amirffeiz et al, Abstracts of 5th Symp. on Semi. Wafer Bonding: Science, Tech. and Appl., The Electrochemical Society, 99-2, Abstract No. 963 (1999). Although these treatments have increased the bond energy obtainable at low or room temperature, they have only been demonstrated with planar silicon wafers or with silicon wafers using a plasma process that results in oxide being grown on the wafers during the plasma process. Moreover, these treatments have only been used to increase the bond energy by charging or damaging the surface. Furthermore, these treatments have not been used or shown to be applicable to deposited dielectrics or other materials.

Obtaining low or room temperature bonding with a method that is not only applicable to planar silicon and grown oxide surfaces but further to deposited materials and non-planar surfaces with planarized deposited materials will allow generic materials, including processed semiconductor wafers, to be bonded with minimal damage for manufacturing purposes. Such a method based on etching and chemical bonding is described herein.

SUMMARY OF THE INVENTION

It is an object of the invention to provide a method for bonding materials at low or room temperature.

It is another object of the invention to bond materials by cleaning and activating the bonding surfaces to promote chemical bond formation at about room temperature.

It is a further object of the invention to provide a bonding method to bond any solid state material such as processed device or integrated circuit wafers or thermally sensitive or mis-matched materials at or about room temperature.

It is further object of the invention to provide a bonding method to bond processed device or integrated circuit wafers of different types of devices or different technologies, and transfer a layer of devices or circuits at or about room temperature.

It is another object of the invention to enable a direct wafer bonding method that does not require annealing to achieve a required bond strength.

It is a further object of the invention to provide a method whereby diverse materials including those with non-planar surfaces and deposited materials can be planarized and bonded.

These and other objects are achieved by a method of bonding having steps of forming first and second bonding surfaces, etching the first and second bonding surfaces, and bonding together at room temperature the first and second bonding surfaces after said etching step. The etching may include etching the first and second bonding surfaces such that respective surface roughnesses of the first and second bonding surfaces after said etching are substantially the same as respective surface roughnesses before said etching. The surface roughness may be in a range of 0.1 to 3.0 nm.

The bonding surfaces may be the surface of a deposited insulating material, such as silicon oxide, silicon nitride or a dielectric polymer. The bonding surface may also be the surface of a silicon wafer. Silicon wafers, using either the surface of the wafer or a deposited material on the wafer, may be bonded together. The wafers may have devices or integrated circuits formed therein. The devices and circuits in the wafers bonded together may be interconnected. The wafers may have a non-planar surface or an irregular surface topology upon which a material is deposited to form the bonding surfaces.

Forming at least one of the bonding surfaces may include depositing a polishable material on a non-planar surface. Depositing said polishable material may include depositing one of silicon oxide, silicon nitride or a dielectric polymer. The bonding surfaces may be polished using a method such as chemical-mechanical polishing. The surfaces may also be etched prior to the polishing.

The etching step may also include activating the first and second bonding surfaces and forming selected bonding groups on the first and second bonding surfaces. Bonding groups may also be formed capable of forming chemical bonds at approximately room temperature, and chemical bonds may be formed between the bonding surfaces allowing bonded groups to diffuse or dissociate away from an interface of the bonding surfaces. The chemical bonds can increase the bonding strength between the bonding surfaces by diffusing or dissociating away said bonding groups.

After said etching step, the bonding surfaces may be immersed in a solution to form bonding surfaces terminated with desired species. The species may comprise at least one of a silanol group, an $NH_2$ group, a fluorine group and an HF group. Also, a monolayer of one of a desired atom and a desired molecule may be formed on the bonding surface. Terminating the surface may include rinsing said bonding materials in an ammonia-based solution after said slightly etching. The ammonia-based solution may be ammonium hydroxide or ammonium fluoride.

The method may also include exposing the bonding surfaces to one of an oxygen, argon, $NH_3$ and $CF_4$ RIE plasma process. Silicon dioxide may be deposited as to form the bonding surfaces, and etched using the RIE process.

The etching process may create a defective or damaged zone proximate to the bonding surfaces. The defective or damaged zone can facilitate the removal of bonding by-products through diffusion or dissociation.

The method may also include steps of forming first and second bonding surfaces, etching the bonding surfaces, terminating the bonding surfaces with a species allowing formation of chemical bonds at about room temperature, and bonding the bonding surfaces at about room temperature, or may include steps of forming the bonding surfaces each having a surface roughness in a range of 0.1 to 3 nm, removing material from the bonding surfaces while maintaining said surface roughness, and directly bonding the bonding surfaces at room temperature with a bonding strength of at least 500 mJ/m$^2$, at least 1000 mJ/m$^2$, or at least 2000 mJ/m$^2$.

The objects of the invention may also be achieved by a bonded device having a first material having a first etched bonding surface, and a second material having a second etched bonding surface directly bonded to the first bonding surface at room temperature having a bonding strength of at least 500 to 2000 mJ/m$^2$. The bonding surfaces may be being activated and terminated with a desired bonding species, and the desired species may include a monolayer of one of a desired atom and a desired molecule on said bonding surface or at least one of a silanol group, an $NH_2$ group, a fluorine group and an HF group. The bonding surfaces may each have a defective region located proximate to said first and second bonding surfaces, respectively.

The first material may include a surface of a first semiconductor wafer having devices formed therein, and the second material may include a surface of a second semiconductor wafer having devices formed therein. Devices in the wafers may be interconnected, and the wafers may be of different technologies. The wafers may also have an integrated circuit formed therein, and devices or circuits in the wafers may be interconnected.

One of said first and second wafers may be a device region after removing a substantial portion of a substrate of said one of said first and second wafers. The wafers may have an irregular surface topology.

The first material may include a first wafer containing electrical devices and having a first non-planar surface, and the first bonding surface may include a polished and etched deposited oxide layer on said first non-planar surface. The second material may include a second wafer containing electrical devices and having a second non-planar surface, and the second bonding surface may include a polished, planarized and slightly etched deposited oxide layer on the second non-planar surface.

The first material may include a first wafer containing electrical devices and having a first surface with irregular topology, and the first bonding surface may include a polished, planarized and slightly etched deposited oxide layer on the first surface. The second material may include a second wafer containing electrical devices and having a second surface with irregular topology, and the second bonding surface may include a polished, planarized and slightly etched deposited oxide layer on the second surface.

The bonded device according to the invention may also include a first material having a first etched and activated bonding surface terminated with a first desired bonding species, and a second material having a second etched and activated bonding surface terminated with a second desired bonding species bonded to the first bonding surface at room temperature.

BRIEF DESCRIPTION OF THE DRAWINGS

A more complete appreciation of the invention and many of the attendant advantages thereof are readily obtained as the same become better understood by reference to the following detailed description when considered in connection with the accompanying drawings, wherein:

FIGS. 5A-5E are diagrams illustrating bonding according to the invention using silicon;

DESCRIPTION OF THE PREFERRED EMBODIMENTS

Referring to FIGS. 1 and 3A-3E, a first embodiment of the method according to the invention will be described. Wafer 30, preferably a processed semiconductor device wafer and more preferably a processed silicon device wafer, contains a device layer 31 with processed devices. Device layer 31 may contain a number of layers and include surface regions of wafer 30. The surface topography of layer 31 is typically nonplanar. Layer 31 may also represent a processed integrated circuit containing any number of layers such as active devices, interconnection, insulation, etc.

The integrated circuit may be fully processed, or partially processed where the remaining processing is performed after the bonding process. The processing after the bonding may include full or partial substrate removal or via formation between the bonded wafers for interconnection.

Figure 1:
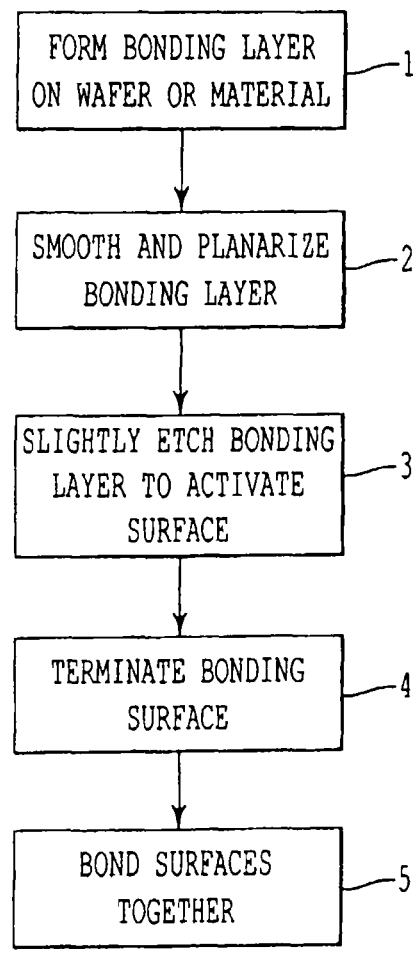
FIG. 1 is a flow chart of the method according to the invention.

On layer 31 a bonding layer 32 is formed (step 1, FIG. 1). Bonding layer 32 may be any solid state material or mixed materials which can be deposited or formed at low temperatures and can be polished to a sufficiently smooth surface. Layer 32 may be an insulator, such as $SiO_2$, silicon nitride, amorphous silicon formed using chemical vapor deposition (CVD) or plasma-enhanced CVD (PECVD), sputtering or by evaporation. Other materials such as polymers, semiconductors or sintered materials may also be used. Layer 32 should have thickness greater than the surface topography of layer 31.

Figure 3A:
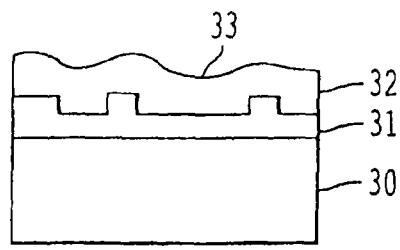
FIGS. 3A-3E are diagrams illustrating a first embodiment of a method according to 113 the invention.
Figure 3B:
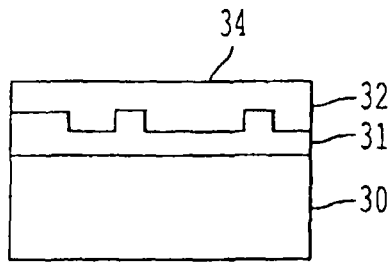

The surface 33 of layer 32 is planarized and smoothed, as shown in step 2 of FIG. 1 and in FIG. 3B. It is noted that the roughness/planarity of surface 33 is exaggerated in FIG. 3A for illustrative purposes. This step may be accomplished using chemical-mechanical polishing. Surface 33 is preferably polished to a roughness of about no more than about 3 nm and preferably no more than about 0.1 nm and be substantially planar. The surface roughness values are typically given as root-mean square (RMS) values. Also, the surface roughness may be given as mean values which are nearly the same as the RMS values. After polishing surface 33 is cleaned and dried to remove any residue from the polishing step. Polished surface 33 is preferably then rinsed with a solution.

The bonding surface may also be etched prior to polishing to improve the planarity and/or surface roughness. The etching can be effective to remove high spots on the bonding surface by selective etching of the high spots using, for example, standard photolithographic techniques. For example, a layer of silicon nitride can be embedded within a silicon dioxide bonding layer 32 that can serve as an etch stop when using a solution containing HF. The etch stop material may be used to improve uniformity, reproducibility, and manufacturability.

Figure 3C:
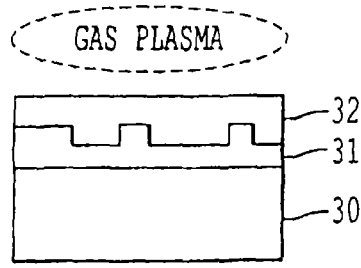

FIG. 3B illustrates layer 32 having upper surface 34 after the polishing/planarization and cleaning steps. Surface 34 then undergoes an activation process (step 3, FIG. 1). This activation process is an etching process and preferably a very slight etch (VSE) process. The term VSE means that the root-mean-square micro-roughness (RMS) of the very slightly etched surface remains at approximately the unetched value, typically <0.5 nm and preferably in the range of 0.1 nm to 3 nm. The optimum amount of material removed depends upon the material and the method used for removal. Typical amounts removed vary from Angstroms to a few nanometers. It is also possible to remove more material. VSE also includes the breaking of bonds on the treated surfaces and can occur without significant removal of material. The VSE is distinct from simple modification of the surface by, for example, charging the surface with electronic charge or damaging the surface layer. In a first example of the method according to the invention, the VSE process consists of a gas or mixed gas (such as oxygen, argon, nitrogen, $CF_4$, $NH_3$) plasma process at a specified power level for a specified time (FIG. 3C). The power and duration of the plasma process will vary depending upon the materials used to obtain the desired bond energy. Examples are given below, but in general, the power and duration will be determined empirically.

The plasma process may be conducted in different modes. Both reactive ion etch (RIE) and plasma modes may be used, as well as an inductively-coupled plasma mode (ICP). Sputtering may also be used. Data and examples are given below in both the RIE and plasma modes.

The VSE process etches the surface very slightly via physical sputtering and/or chemical reaction and preferably is controlled to not degrade the surface roughness of the bonding surfaces. The surface roughness may even be improved depending upon the VSE and materials etched. Almost any gas or gas mixture that will not etch surface 34 excessively can be used for the room temperature bonding method according to the invention.

The VSE serves to clean the surface and break bonds of the oxide on the wafer surface. The VSE process can thus enhance the surface activation significantly. A desired bonding species can be used to terminated on surface 34 during the VSE by proper design of the VSE. Alternatively, a post-VSE treatment that activates and terminates the surface with a desired terminating species during the post-VSE process may be used.

Figure 3D:
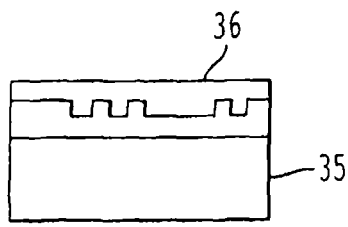

The desired species further preferably forms a temporary bond to the surface 34 atomic layer, effectively terminating the atomic layer, until a subsequent time that this surface can be brought together with a surface terminated by the same or another bonding species 36 as shown in FIG. 3D. Desired species on the surfaces will further preferably react with each other when they are in sufficiently close proximity allowing chemical bonding between surfaces 34 and 36 at low or room temperature that is enhanced by diffusion or dissociation and diffusion of the reacted desired species away from the bonding interface.

The post-VSE process preferably consists of immersion in a solution containing a selected chemical to generate surface reactions that result in terminating the bonding surface 34 with desired species. The immersion is preferably performed immediately after the VSE process. The post-VSE process may be performed in the same apparatus in which the VSE process is conducted. This is done most readily if both VSE and post-VSE processes are either dry, i.e, plasma, RIE, ICP, sputtering, etc, or wet, i.e., solution immersion. A desired species preferably consists of a monolayer or a few monolayers of atoms or molecules.

The post-VSE process may also consist of a plasma, RIE, or other dry process whereby appropriate gas chemistries are introduced to result in termination of the surface with the desired species. The post-VSE process may also be a second VSE process. The termination process may also include a cleaning process where surface contaminants are removed without VSE. In this case, a post-cleaning process similar to the post-VSE processes described above then results in a desired surface termination.

The post-VSE or post-cleaning process may or may not be needed to terminate surfaces with desired species if the activated surface bonds by the cleaning or VSE process are subsequently sufficiently weakly surface reconstructed and can remain sufficiently clean before bonding such that subsequent bonding with a similar surface can form a chemical bond.

Figure 3E:
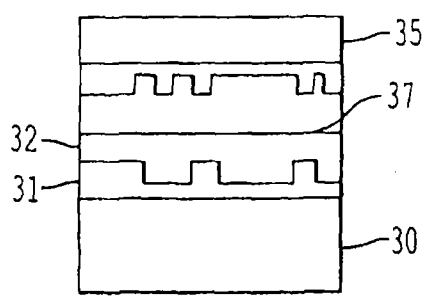

The wafers are optionally rinsed then dried. Two wafers are bonded by aligning them (if necessary) and bringing them together to form a bonding interface. As shown in FIG. 3D, a second wafer 35 has been processed in the manner shown in FIG. 3C to prepare bonding surface 36. The two wafers are brought together by, for example, commercially available wafer bonding equipment (not shown) to initiate bonding interface 37 (FIG. 3E).

A spontaneous bond then typically occurs at some location in the bonding interface and propagates across the wafer. As the initial bond begins to propagate, a chemical reaction such as polymerization that results in chemical bonds takes place between species used to terminate surfaces 34 and 36 when the surfaces are in sufficient proximity. The bonding energy is defined as the specific surface energy of one of the separated surfaces at the bonding interface that is partially debonded by inserting a wedge. The by-products of the reaction then diffuse away from the bonding interface to the wafer edge or are absorbed by the wafers, typically in the surrounding materials. The by-products may also be converted to other by-products that diffuse away or are absorbed by the wafers. The amount of covalent and/or ionic bonding may be increased by removal of converted species resulting in further increase in bond strength.

Figure 4A:
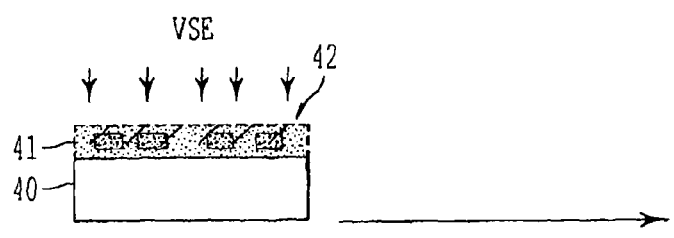
FIGS. 4A-4E are diagrams illustrating bonding according to the invention using silicon oxide.
Figures 4B, 4C:
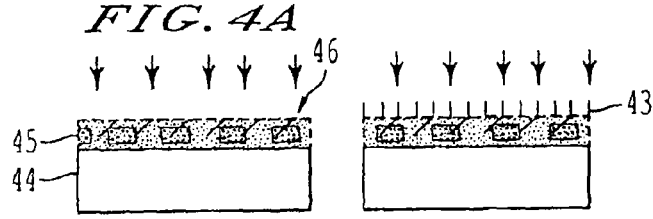
Figure 4D:
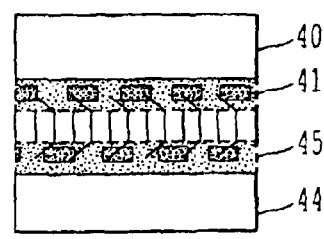
Figure 4E:
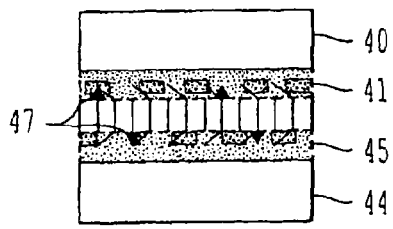

FIGS. 4A-4E show surface conditions and the bonding propagation to form covalent bonds in a the case of a planar Si wafer covered with silicon oxide. On Si wafer 40 an $SiO_2$ layer 41 is formed, which has been polished and planarized. Surface 42 of layer 41 is subjected to the VSE process to produce an activated surface (FIG. 4A). On a second wafer 44 a second $SiO_2$ layer 45 is formed, and surface 46 is subjected to a VSE process to activate surface 46 (FIG. 4B). Desired species are terminated on surface 46 and are shown as lines 43 in FIG. 4C. Either or both of a VSE and post-VSE processes are used to properly terminate surface 46. While not shown, surface 42 may also be terminated using a post-VSE process. Wafer 44 is brought together with wafer 40 (FIG. 4D) and bonds 46 begin to form. The bonding propagates and by-products are removed (indicated as arrows 47) and chemical bonds (such as covalent) are formed, as shown in FIG. 4E.

Figure 7:
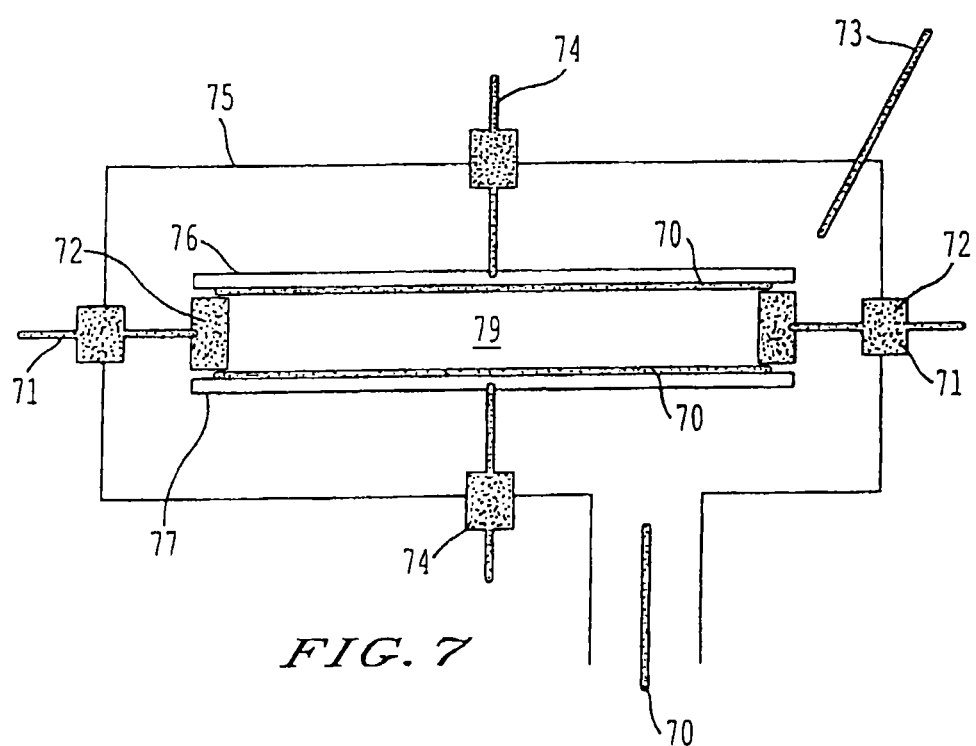
FIG. 7 is a diagram of a bonding fixture used in the invention.

The bonding immediately after the RIE process may use a special bonding fixture allowing immediate in situ bonding of the etched wafers. A diagram of the fixture is shown in FIG. 7. In plasma chamber 75 are two wafers to be bonded 70 disposed on RF electrodes 76 and 77. A plasma is formed in zone 79 by the application of RF power to the electrodes via moveable vacuum RF power feedthrough 74 and by the introduction of an appropriate gas or gas mixture through gas feedthrough 73. Element 71 is a vacuum feedthrough for mechanical actuator (not shown) to retract retractable spacer 72. Chamber 75 is pumped down to a desired vacuum level via pumps (not shown) and chamber inlet 78. In the case where a post-VSE process or post cleaning process is also a dry process, as discussed above, the VSE and post-VSE or post-cleaning may be conducted in chamber 75.

After the plasma treatment to conduct the VSE process, the mechanical spacers 72 are retracted by the mechanical actuator and the wafers 70 are moved into contact with to begin the bonding process. The bonded wafers are then moved from the chamber into ambient or into another vacuum chamber (not shown) and stored for a desired period to allow the bonding to propagate by a wafer handling system (not shown).

The materials of the bonding layers preferably have an open structure so that the by-products of the polymerization reaction can be easily removed. The bonding species on the opposing bonding surfaces must be able to react at room temperature to form a strong or chemical bond. The bond energy is sufficiently high to virtually eliminate slippage between wafers after subsequent heat treatments associated with a subsequent processing or operation when wafers have different thermal expansion coefficients. Lack of slippage is manifest by a lack of wafer bowing upon inspection after the subsequent processing or operation.

In order to achieve the high bonding energies, it is preferable for at least one of the wafers to be as thin as possible because a thin wafer allows compliance to accommodate a lack of perfect surface planarization and smoothness. Thinning to thickness of about 10 mils to 10 microns is effective.

The bonded wafers are preferably stored at ambient or at low or room temperature after bonding to allow removal of species or converted species for a specified period of time depending upon the materials and species used. Twenty four hours is usually preferable. The storage time is dependent upon the type of plasma process used. Chemical bonds may be obtained more quickly, in a matter of minutes, when certain plasma processes such as an Ar plasma are used. For example, 585 $mJ/m^2$ bonds were obtained in immediately after bonding and over 800 $mJ/m^2$ were observed after 8 hours for deposited oxides etched by an Ar plasma followed by $NH_4OH$ dip.

Annealing the bonded wafers during bonding may increase the bonding strength. The annealing temperature should be below 200 EC and may be typically in the range of 75-100 EC. Storing the bonded wafers under vacuum may facilitate the removal of residual gasses from the bonding surfaces, but is not always necessary.

All of the processes above may be carried out at or near room temperature. The wafers are bonded with sufficient strength to allow subsequent processing operations (lapping, polishing, substrate removal, chemical etching, lithography, masking, etc.). Bonding energies of approximately 500-2000 $mJ/m^2$ or more can be achieved (see FIG. 6A).

At this point (FIG. 3E) it is possible to remove a part or all of the substrate of wafer 35 by, for instance, lapping and etch back. The layer of devices of wafer 35 is thus transferred onto wafer 30. The devices from the two layers may be interconnected. Additional device or circuit layers may be bonded and interconnected to form a multilayer structure. Different types of wafers, devices or circuits may be bonded, as well as different technologies (i.e. CMOS and bipolar or III-V HBT and Si CMOS). Other elements or materials such as thermal spreaders, surrogate substrates, antennas, wiring layers, a pre-formed multi-layer interconnects, etc. may be bonded to produce different types of circuits or systems, as desired.

Figure 2:
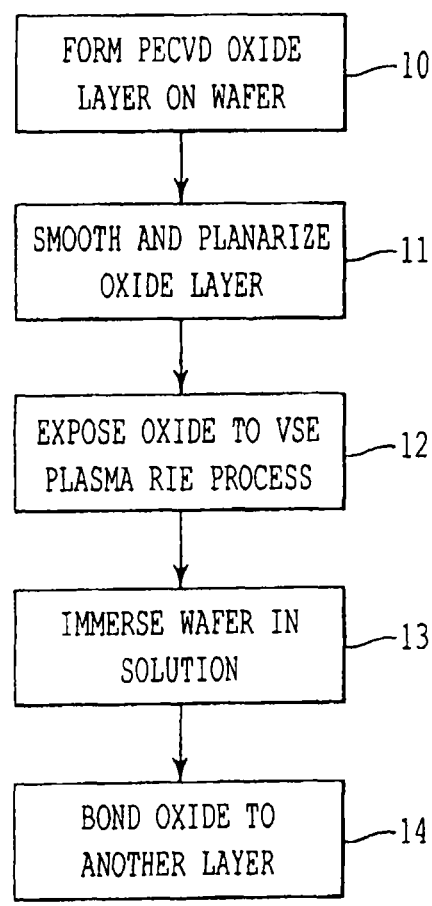
FIG. 2 is a flow chart of an example of the method according to the invention.

In an example, shown in FIG. 2, PECVD $SiO_2$ is deposited on a Si wafer containing devices. Surface 34, after the plasma (such as argon, oxygen or $CF_4$) treatment, is mainly terminated by Si—OH groups due to the availability of moisture in the plasma system and in air. After the plasma treatment, the wafers are immediately immersed in solution such as ammonium hydroxide ($NH_4OH$), $NH_4F$ or HF for a period such as between 10 and 120 seconds. After immersing the wafers in the $NH_4OH$ solution, many Si—OH groups are replaced by Si—NH2 groups according to the following substitution reaction:

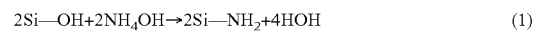

$$2Si-OH + 2NH_4OH \rightarrow 2Si-NH_2 + 4HOH \qquad (1)$$

Alternatively, many Si—F groups are terminating on the PECVD $SiO_2$ surface after an $NH_4F$ or HF immersion.

The hydrogen bonded Si—NH2:Si—OH groups or Si—NH2:Si—NH2 groups across the bonding surfaces can polymerize at room temperature in forming Si—O—Si or Si—N—N—Si (or Si—N—Si) covalent bonds:

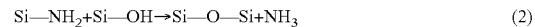

$$Si-NH_2 + Si-OH \rightarrow Si-O-Si + NH_3 \qquad (2)$$

$$Si-NH_2 + Si-NH_2 \rightarrow Si-N-N-Si + 2H_2 \qquad (3)$$

Alternatively, the HF or $NH_4F$ dipped oxide surfaces are terminated by Si—F groups in addition to Si—OH groups.

Since HF or NH$_4$F solution etches silicon oxide strongly, their concentrations must be controlled to an adequately low level, and the immersion time must be sufficiently short. This is an example of a post-VSE process being a second VSE process. The covalent bonds across the bonding interface are formed due to the polymerization reaction between hydrogen bonded Si—HF or Si—OH groups:

$$\text{Si—HF+Si—HF} \rightarrow \text{Si—F—F—Si+H}_2 \tag{4}$$

$$\text{Si—F+Si—OH} \rightarrow \text{Si—O—Si+HF} \tag{5}$$

Figure 8:
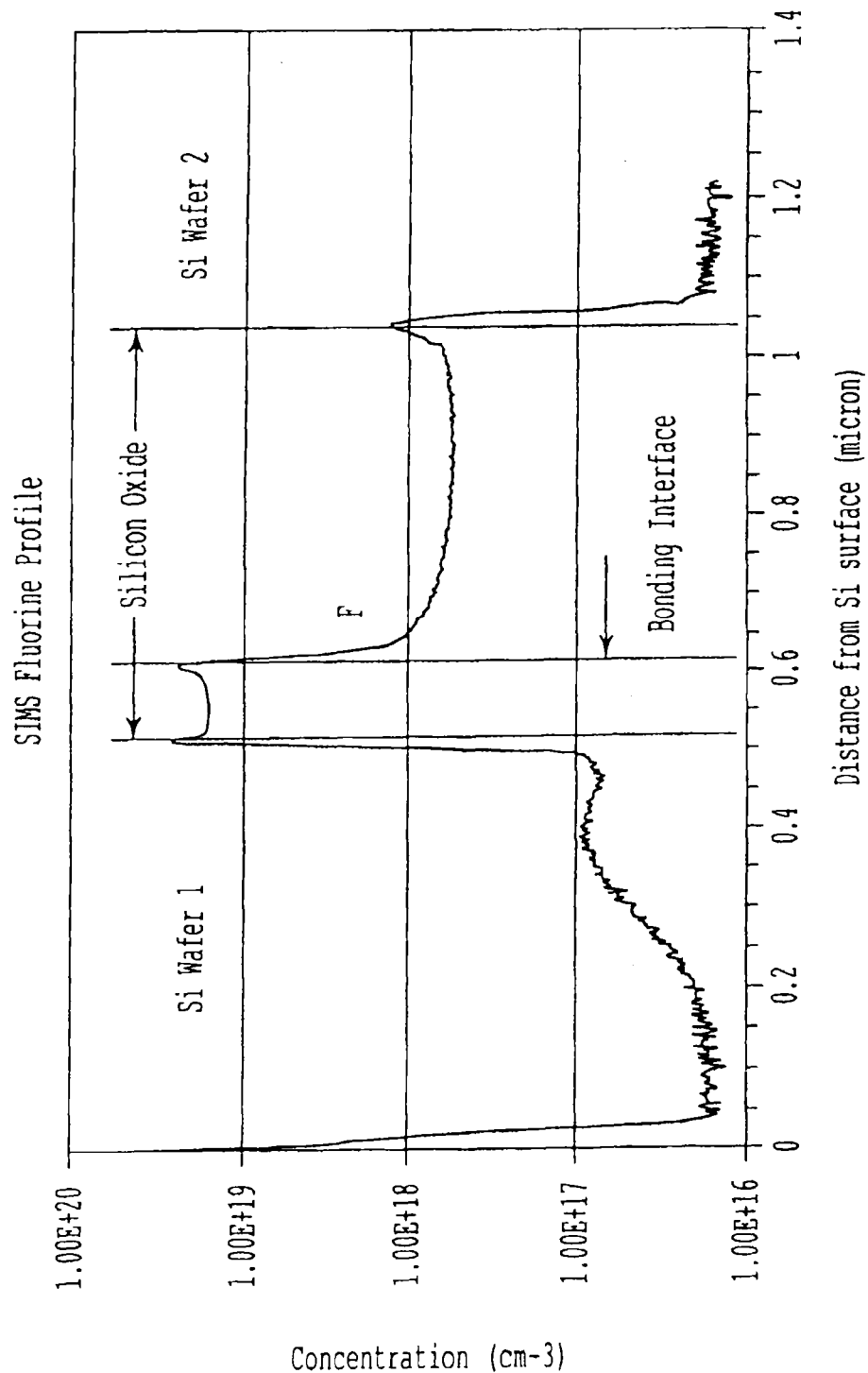
FIG. 8 is a fluorine concentration profile by SIMS (Secondary Ion Mass Spectroscopy) near the bonding interface of deposited oxide covered silicon wafers that were very slight etched by diluted HF before bonding.

FIG. 8 shows the fluorine concentration profile of bonded thermal oxide covered silicon wafers that were dipped in 0.05% HF before room temperature bonding. A fluorine concentration peak is clearly seen at the bonding interface. This provides evidence of the chemical process described above where the desired species are located at the bonding interface.

Since reaction (2) is reversible only at relatively high temperatures of ~500 EC, the formed siloxane bonds should not be attacked by NH$_3$ at lower temperatures. It is known that H$_2$ molecules are small and diffuse about 50 times quicker than water molecules in oxide. The existence of a damaged layer near the surface of an adequate thickness i.e. a few nm, will facilitate the diffusion or dissolution of NH$_3$, and HF and hydrogen in reactions (2), (3), (4) and/or (5) in this layer and enhancement of the chemical bond. The three reactions result in a higher bonding energy of SiO$_2$/SiO$_2$ bonded pairs at room temperature after a period of storage time to allow NH$_3$ or H$_2$ to diffuse away.

In the example of FIG. 2, the plasma treatment may create a damaged or defective area in the oxide layer near the bonding surface. The zone extends for a few monolayers. The damaged or defective area aids in the removal of bonding by-products. Efficient removal of the bonding by-products improves the bonding strength since the by-products can interfere with the bonding process by preventing high-strength bond from forming.

Many different surfaces of materials may be smoothed and/or planarized, followed by a cleaning process, to prepare for bonding according to the invention. These materials can be room temperature bonded by mating surfaces with sufficient planarity, surface smoothness, and passivation that includes cleaning, and/or VSE, activation and termination. Amorphous and sintered materials, non-planar integrated circuits, and silicon wafers are examples of such materials. Single crystalline semiconductor or insulating surfaces, such as SiO$_2$ or Si surfaces, can also be provided with the desired surface roughness, planarity and cleanliness. Keeping the surfaces in high or ultra-high vacuum simplifies obtaining surfaces sufficiently free of contamination and atomic reconstruction to achieve the strong bonding according to the invention. Other semiconductor or insulator materials such as InP, GaAs, SiC, sapphire, etc., may also be used. Also, since PECVD SiO$_2$ may be deposited on many types of materials at low temperatures, many different combinations of materials may be bonded according to the invention at room temperature. Other materials may also be deposited as long as appropriate processes and chemical reactions are available for the VSE, surface activation, and termination.

For example, the method may also be used with silicon nitride as the bonding material. Silicon nitride may be bonded to silicon nitride, or to silicon dioxide and silicon. Silicon oxide may also be bonded to silicon. Other types of dielectric materials may be bonded together including aluminum nitride and diamond-like carbon.

The method may be applied to planar wafers having no devices or circuits and one wafer with devices and circuits.

The planar wafer may be coated with a bonding layer, such as PECVD oxide or amorphous silicon, and then processed as described above to bond the two wafers. The planar wafer may not need to be coated with a bonding layer if it has sufficient smoothness and planarity and the proper bonding material.

As can be appreciated, the bonding process may be repeated with any number of wafers, materials or functional elements. For example, two device or IC wafers may be joined, followed by removing one of the exposed substrates to transfer a layer or more of devices, or just the active regions of an IC.

The bonding according to the invention may be applied to joining different types of materials. For example, a silicon wafer can be bonded to another silicon wafer, or bond to an oxidized silicon wafer. The bare silicon wafer and the oxide covered wafer are immersed in HF, NH$_4$F and/or NH$_4$OH and bonded after drying. The time for the immersion should be less than about twenty minutes for the silicon wafer covered with the thin oxide since the NH$_4$OH solution etches silicon oxide. Since HF and NH$_4$F etches oxides strongly, very diluted solutions, preferably in 0.01-0.2% range should be used for dipping of the silicon wafers.

After drying the silicon wafer and the oxide-covered wafer are bonded in ambient at room temperature. Reactions (2), (3), (4) and/or (5) take place at the bonding interface between the two wafers. The plasma-treated wafers may also be immersed in deionized water instead of the NH$_4$OH solution.

The silicon bonding may be conducted with a bare silicon wafer, i.e. having a native oxide or a silicon wafer having an oxide layer formed on its surface as described above. During the oxygen plasma treatment, the native oxide which if formed on the bare silicon wafer is sputter etched, and the oxide layer formed on the silicon surface is etched. The final surface is an activated (native or formed) oxide. When rinsed in deionized water, the activated oxide surface is mainly terminated with Si—OH groups. Since oxide growth in oxygen plasma has been found to have less water than in normal native oxide layers, the water from the original bonding bridge and generated by the following polymerization reaction (6) can be absorbed into the plasma oxide readily.

$$\text{Si—OH+Si—OH} \rightarrow \text{Si—O—Si+H}_2\text{O} \tag{6}$$

FIGS. 5A-5E illustrate bonding two silicon wafers. Wafers 50 and 52 have respective surfaces 51 and 53 with native oxides (not shown) subjected to a VSE process (FIGS. 5A and 5B). Surface 53 is in FIG. 5C is shown terminated with a desired species 54. The two wafers are brought together and bonds 55 begin to form (FIG. 5D). The bonding propagates and bonding by-products, in this case H$_2$ gas, are removed. The by-products being removed are shown as arrows 56 in FIG. 5E.

In addition to removal of the water from the bonding interface by dissolving into the plasma activated oxide of the oxidized silicon wafer, the water can also diffuse through the thin oxide layer on the bare silicon wafer to react with silicon: As the silicon surface underneath the oxide has a damaged or defective zone, extending for a few monolayers, the water molecules that diffuse through the oxide layer and reach the damaged or defective zone can be converted to hydrogen at room temperature and be removed readily:

$$\text{Si+2H}_2\text{O} \rightarrow \text{SiO}_2+2\text{H}_2 \tag{7}$$

The reverse reaction of (6) is thus avoided and the room temperature bonding energy increases enormously due to the formation of covalent Si—O—Si bonds.

If a relatively thick (~5 nm) oxide layer is formed, it will take a long period of time for the water molecules to diffuse through this thick layer. On the other hand, if after the plasma treatment a thin oxide layer is left or a too narrow defective zone is formed, water that can reach the silicon surface may not react sufficiently with the silicon and convert to hydrogen. In both cases the bonding energy enhancement will be limited. The preferred oxygen plasma treatment thus leaves a minimum plasma oxide thickness (e.g., about 0.1-1.0 nm) and a reasonably thick defective zone (e.g., about 0.1-0.3 nm) on the silicon surface.

In a second embodiment, the VSE process uses wet chemicals. For example, an InP wafer having a deposited silicon oxide layer, as in the first embodiment, and a device layer are bonded to a AlN substrate having a deposited oxide layer. After smoothing and planarizing the InP wafer bonding surface and the AlN wafer bonding surface, both wafers are cleaned in an standard RCA cleaning solution. The wafers are very slightly etched using a dilute HF aqueous solution with an HF concentration preferably in the range of 0.01 to 0.2%. About a few tenths of a nm is removed and the surface smoothness is not degraded as determined by AFM (atomic force microscope) measurements. Without deionized water rinse, the wafers are spin dried and bonded in ambient air at room temperature. The resulting bonding energy has been measured to reach ~700 mJ/m$^2$ after storage in air. After annealing this bonded pair at 75° C. the bonding energy of 1500 mJ/m$^2$ was obtained. The bonding energy has been measured to reach silicon bulk fracture energy (about 2500 mJ/m$^2$) after annealing at 100° C. If the wafers are rinsed with deionized water after the HF dip, the bonding energy at 100° C. is reduced to 200 mJ/m$^2$, that is about one tenth of that obtained without the rinse. This illustrates the preference of F to OH as a terminating species.

In a third embodiment the VSE process consists of 0.1% HF etching followed by 5 min dip in 0.02% HN$_4$F solution of thermally oxidized silicon wafers at room temperature after a standard cleaning process. Without rinsing in deionized water, the wafers are bonded after spin drying at room temperature. The bonding energy of the bonded pairs reaches ~1700 mJ/m$^2$ after 100° C. annealing. If the wafers are rinsed in de-ionized water after the HF etching before bonding, the bonding energy of bonded pairs is only 400 mJ/m$^2$, again illustrating the preference of F to OH as a terminating species. Dilute NH$_4$F is used in the VSE process to etch silicon oxide covered wafers in a fourth embodiment. The concentration of the NH$_4$F should be below 0.02% to obtain the desired bonding. The bonding energy of ~600 mJ/m can be achieved at room temperature after storage.

A fifth embodiment of the invention is used to bond Si surfaces having a native oxide of about 1 nm in thickness. In the fifth embodiment, after cleaning the Si surface by a standard RCA1 cleaning process, a VSE process using 5 min etching in 70% HNO$_3$+diluted HF (preferably 0.01 to 0.02%) is performed. Wafers are pulled out of the solution vertically with a basically hydrophobic surface. Without rinsing in water, the wafers were bonded at room temperature in air. In this process covalent bonding occurs at room temperature with measured bonding energies typically about 600 mJ/m$^2$. This bonding energy is significantly increased to 1300 mJ/m$^2$ after annealing at 75° C. and reaches the fracture energy of bulk silicon (about 2500 mJ/m$^2$) at a temperature of 100° C.

Instead of 70% HNO$_3$, diluted HNO$_3$ with water can be used in the solution to achieve similar results. According to AMF measurements and high resolution transmission electron microscopy measurement results, the silicon is etched in the dilute HNO$_3$ VSE process at a rate of 0.1-0.15 nm/min and a new thick oxide 2.5-3.5 nm in thickness is formed.

As further embodiments, the VSE process may consist of a dry etch that has chemical and/or physical components. For a bare Si surface, chemical etching may result from SF$_4$/H$_2$ gas mixture while physical etching may result from Ar etch. For a silicon oxide surface, chemical etching may use CF$_4$ while physical etching may use oxygen or argon gas. It is also possible to use a thermally stable polymer material for the bonding materials and bond two polymer surfaces together. Examples are polyimides or spin-on materials.

The mechanisms governing the increased bond energy at low or room temperature are similar. A very slight etching (VSE) of the bonding wafers by plasma to clean and activate the surfaces, and improve removal of by-products of interface polymerization to prevent the undesirable reverse reaction and rinse in appropriate solution to terminate the surface with desired species to facilitate room temperature covalent bonding. The oxide covered wafer bonding case is similar except that a different surface termination is preferred. In bare silicon wafer bonding, the highly reactive surface layers of oxide and silicon to allow water adsorption and conversion to hydrogen should be formed. The highly reactive layers can be a plasma thin oxide layer and a damaged silicon surface layer. The oxide on the silicon wafer will also have some damage. Not only O$_2$ plasma but also plasma of other gases (such as Ar, CF$_4$) are adequate. Because during and after VSE the silicon surface is readily to react with moisture to form an oxide layer, and the underlying damaged silicon layer is created by VSE. Since the VSE and by-products removal methods are rather general in nature, this approach can be implemented by many means and apply to many materials.

EXAMPLE 1

In a first example, three inch <100>, 1-10 ohm-cm, boron doped silicon wafers were used. PECVD oxide was deposited on some of the silicon wafers. For comparison, thermal oxidized silicon wafers were also studied. The PECVD oxide thickness was 0.5 μm and 0.3 μm on the front side and the back side of the wafers, respectively. Oxide is deposited on both sides of the wafer to minimize wafer bow during polishing and improve planarization. A soft polish was performed to remove about 30 nm of the oxide and to smooth the front oxide surface originally having a root mean square of the micro-roughness (RMS) of ~0.56 nm to a final ~0.18 nm. A modified RCA1 solution was used to clean the wafer surfaces followed by spin-drying.

Two wafers were loaded into the plasma system, both wafers are placed on the RF electrode and treated in plasma in RIE mode. For comparison, some wafers were treated in plasma mode in which the wafers were put on the grounded electrode. An oxygen plasma was used with a nominal flow rate of 16 scc/m. The RF power was 20-400 W (typically 80 W) at 13.56 MHz and the vacuum level was 100 mTorr. The oxide covered wafers were treated in plasma for times between 15 seconds to 5 minutes. The plasma treated silicon wafers were then dipped in an appropriate solution or rinse with de-ionized water followed by spin-drying and room temperature bonding in air. Some of the plasma treated wafers were also directly bonded in air without rinse or dipping.

The bonding energy was measured by inserting a wedge into the interface to measure the crack length according to the equation:

$$\gamma = \frac{3 t_b^2 E_1 t_{w1}^3 E_2 t_{w2}^3}{16 L^4 (E_1 t_{w1}^3 + E_2 t_{w2}^3)}$$

E and tw are the Young's modulus and thickness for wafers one and two and tb is the thickness of a wedge inserted between the two wafers that results in a wafer separation of length L from the edge of the wafers.

Figure 6A:
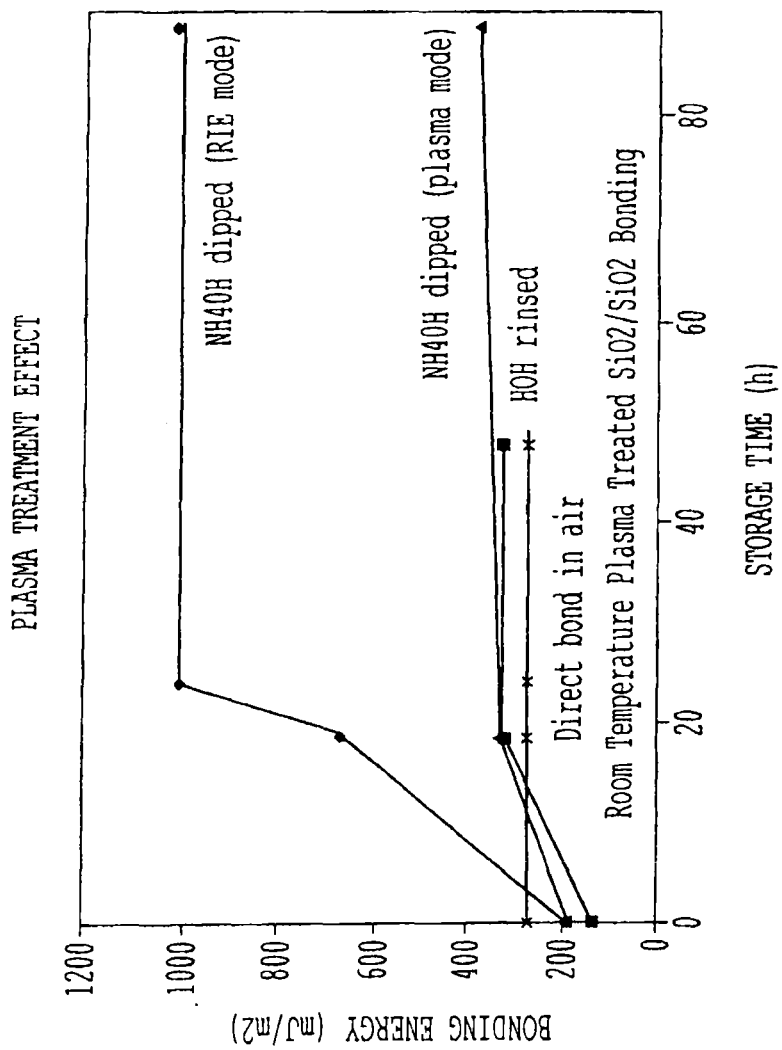
FIGS. 6A and 6B are graphs of room temperature bonding energy versus storage time.

The room temperature bonding energy as a function of storage time of bonded plasma treated oxide covered silicon wafers is shown in FIG. 6A. This figure shows measured room temperature bonding energy versus storage time for 4 different cases as shown. The results can be summarized as follows: (1) for dipped and bonded RIE plasma treated oxide wafers, the room temperature bonding energy increases with storage time and reaches a stable value after ~20 h in air or at low vacuum; (2) RIE mode results in higher bonding energies than plasma mode; (3) too short a plasma exposure time or too low a plasma power provides a small or negligible increase in bond energy; (4) $NH_4OH$ dip after plasma treatment shows a much higher increase in bonding energy than water rinse; (5) direct bonding in air after plasma treatment without dipping or rinse shows an almost constant bonding energy with time. The bonding energy of the directly bonded wafer pairs immediately after room temperature bonding is slightly higher than the de-ionized water rinsed or $NH_4OH$ dipped wafer pairs.

Figure 6B:
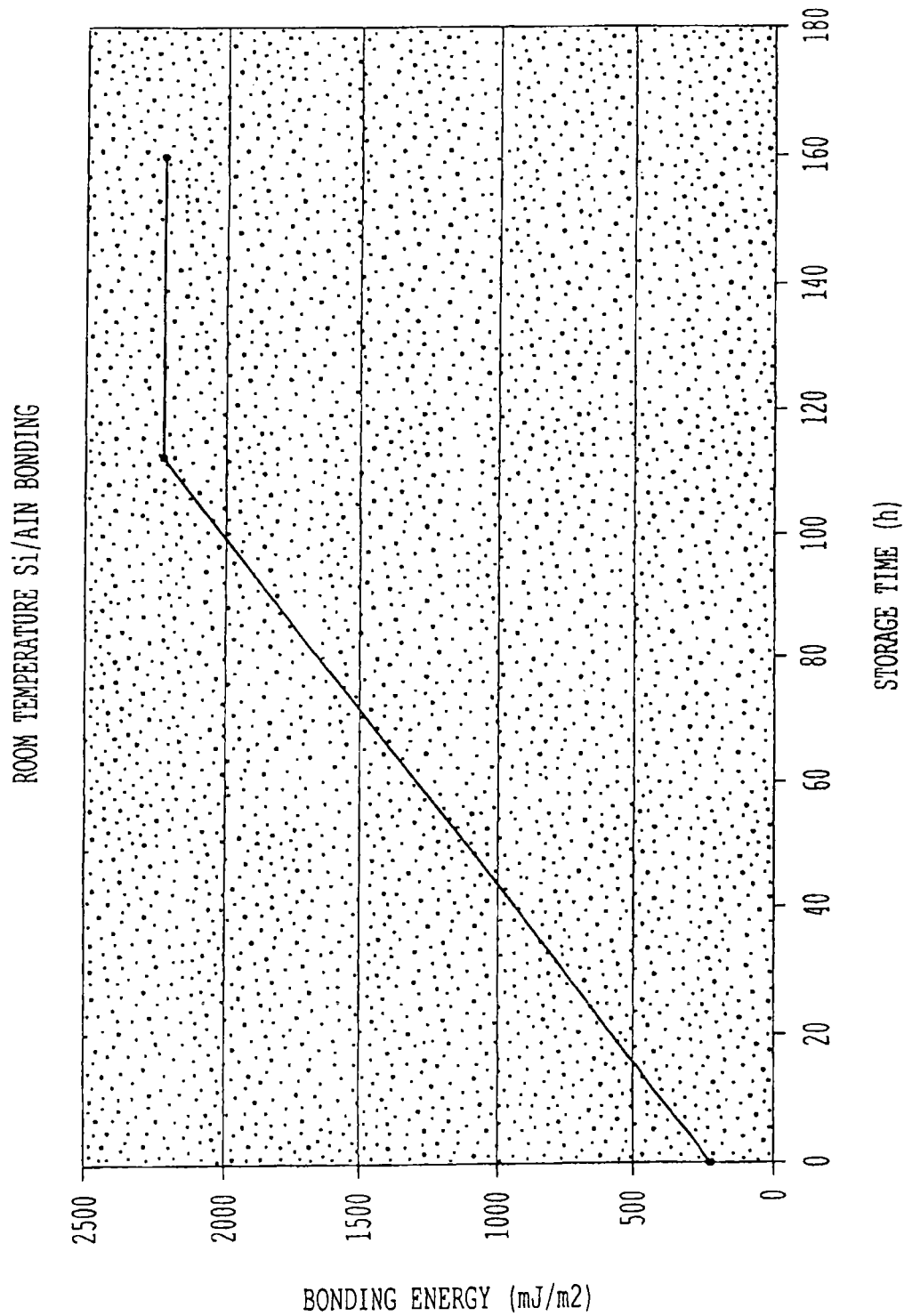

FIG. 6B shows room temperature bonding of Si and AlN wafers with PECVD oxide deposited layers. After about 100 h of storage time a bonding energy of over 2000 $mJ/m^2$ were observed.

Comparing different bonding materials, the bonding energy as a function of storage time of $O_2$ plasma treated thermally oxidized silicon wafer pairs is similar to wafers with PECVD oxide, although the values of the room temperature bonding energy are somewhat lower.

After ~24 h storage in air at room temperature, the bonding energy as high as ~1000 $mJ/m^2$ was reached in the RIE mode plasma treated and $NH_4OH$ dipped PECVD oxide covered wafer pairs. Since the maximum bonding energy of a van der Waals bonded silicon oxide covered wafer pairs is about 200 $mJ/m^2$, a large portion of the bonding energy is attributed to the formation of covalent bonds at the bonding interface at room temperature according to the above equation.

EXAMPLES 2-3

The above process was applied to bond processed InP wafers (600 µm thick) to AlN wafers (380 µm thick), or to bond processed Si (380 µm thick) and InP 600 µm thick) wafers, as second and third examples. The processed InP device wafers are covered with PECVD oxide and planarized and smoothed by chemical-mechanical polishing CMP. A PECVD oxide layer is also deposited on the AlN wafers and is planarized and smoothed to improve the RMS surface roughness. The processed Si and processed InP wafers are deposited with PECVD oxide and planarized and smoothed using CMP. After VSE similar to the example 1 bonding at room temperature, the bonded wafers are left in ambient air at room temperature.

After 24 hours storage at room temperature, bonding energy of 1000 $mJ/m^2$ and 1100 mJ/m2 were achieved for the InP/Si and InP/AlN bonded pairs, respectively. For processed Si (380 µm thick)/oxide covered AlN (280 µm thick) wafer pairs, the bonding energy at room temperature as high as 2500 $mJ/m^2$ has been achieved. These room temperature bonded plasma treated wafer pairs have sufficient bonding strength to sustain subsequent substrate lapping and etching and other typical semiconductor fabrication processes before or after substrate removal.

The InP substrate in the room temperature bonded InP/AlN pairs was lapped with 1900# $Al_2O_3$ powder from initial 600 µm thick to ~50 µm thick followed by etching in an HCl/$H_3PO_4$ solution to leave about a 2.0 µm thick InP device layer on the AlN or Si wafer. The water and etching solution did not penetrate into the bonding interface.

Surfaces are sputter etched by energetic particles such as radicals, ions, photons and electrons in the plasma or RIE mode. For example, the $O_2$ plasma under conditions that bring about the desired VSE is sputter-etching about 2 Å/min of PECVD oxide as measured by a reflectance spectrometry. For thermal oxide the sputter etching rate is about 0.5 Å/min. The thickness of oxide before and after plasma treatment was measured by a reflectance spectrometry and averaged from 98 measured points on each wafer. The etching by $O_2$ plasma has not only cleaned the surface by oxidation and sputtering but also broken bonds of the oxide on the wafer surfaces.

However, the surface roughness of plasma treated oxide surfaces must not be degraded by the etching process. AFM measurements show that compared with the initial surface roughness, the RMS of the $O_2$ plasma treated oxide wafers was ~2 Å and did not change noticeably. On the other hand, if the etching is not sufficiently strong, the bonding energy enhancement effect is also small. Keeping other conditions unchanged when the $O_2$ plasma treatment was performed with plasma mode rather than RIE mode, the etching of oxide surfaces is negligible and the oxide thickness does not change. The final room temperature bonding energy is only 385 $mJ/m^2$ compared to 1000 $mJ/m^2$ of RIE treated wafers (see FIG. 6A).

Other gas plasma has shown a similar effect. $CF_4/O_2$ RIE was used to remove ~4 nm of PECVD oxide from the wafer surfaces prior to bonding. The bonding energy of room temperature bonded PECVD oxide covered silicon wafers was also enhanced significantly in this manner and exceeds 1000 $mJ/m^2$ after sufficient storage time (see also FIG. 6A).

An argon plasma has also been used for the VSE with a nominal flow rate of 16 scc/m. The RF power was typically 60 W at 13.56 MHz and the vacuum level was 100 mTorr. The oxide covered silicon wafers were treated in plasma in RIE mode for times between 30 seconds to 2 minutes. The plasma treated silicon wafers were then dipped in an $NH_4OH$ solution followed by spin-drying and room temperature bonding in air. The bonding energy reached ~800 $mJ/m^2$ at room temperature after only 8 h storage in air.

Obviously, numerous modifications and variations of the present invention are possible in light of the above teachings. It is therefore to be understood that within the scope of the appended claims, the invention may be practiced otherwise than as specifically described herein.

The invention claimed is:

1. A bonded structure, comprising:
    a processed semiconductor device wafer comprising a first surface and a planarized insulating material having a first bonding surface wherein said planarized insulating material is opposite said first surface;
    a first material having a second surface and a second bonding surface opposite said second surface, wherein no devices are disposed in said first material;
    wherein said first bonding surface is an etched surface terminated with a species; and
    wherein said first and second bonding surfaces are in direct contact with each other and bonded together with a chemical bond without any adhesive.

2. The structure as recited in claim 1, wherein devices are contained within said processed semiconductor device wafer.

3. The structure as recited in claim 1, wherein integrated circuits are contained within said processed semiconductor device wafer.

4. The structure as recited in claim 3, wherein said integrated circuits are CMOS integrated circuits.

5. The structure as recited in claim 1, wherein said planarized insulating material is a deposited silicon oxide.

6. The structure as recited in claim 1, wherein said species comprises nitrogen.

7. The structure as recited in claim 1, wherein said first material comprises silicon.

8. The structure as recited in claim 1, wherein said first surface is one surface of a thinned silicon substrate.

9. The structure as recited in claim 8, wherein said thinned silicon substrate has a thickness of about 10 mils to 10 microns.

10. The structure as recited in claim 8, wherein said thinned surface includes a photolithographic mask on at least a portion thereof.

11. The structure as recited in claim 1, wherein said chemical bond has a strength of at least 1000 mJ/m$^2$.

12. The structure as recited in claim 11, wherein said chemical bond has a strength of at least 2000 mJ/m$^2$.

13. The structure as recited in claim 1, wherein said species is a fluorine-containing species.

14. The structure as recited in claim 1, wherein said species is a nitrogen-based species.

15. The structure as recited in claim 14, wherein said planarized insulating material comprises silicon oxide.

16. The structure as recited in claim 1, wherein said second bonding surface of said first material comprises an etched surface.

17. The structure as recited in claim 16, wherein said first surface is one surface of a thinned silicon substrate.

18. The structure as recited in claim 1, wherein said etched surface has a RMS surface roughness of between about 0.1 and 3.0 nm.

19. The structure as recited in claim 18, wherein said RMS surface roughness is between about 0.5 and 1.0 nm.

20. The structure as recited in claim 18, wherein said RMS surface roughness between about 0.1 and 0.5 nm RMS.

21. The structure as recited in claim 1, wherein said second surface comprises an oxide layer.

22. The structure as recited in claim 21, wherein said oxide layer is a native oxide layer.

23. The structure as recited in claim 21, wherein said oxide layer is a formed oxide layer.

24. The structure as recited in claim 21, wherein said oxide layer is about 5 nm thick.

25. The structure as recited in claim 1, wherein said processed semiconductor device wafer further comprises a device layer between said first surface and said planarized insulating material.

26. The structure as recited in claim 25, wherein said device layer comprises one or more layers.

27. The structure as recited in claim 26, wherein said device layer comprises at least two layers.

28. The structure as recited in claim 27, wherein said device layer comprises processed integrated circuitry and at least one insulating layer.

29. The structure as recited in claim 28, wherein said processed integrated circuitry is CMOS integrated circuitry.

30. A bonded structure, comprising:
a processed semiconductor device wafer comprising a first surface having a thickness, a planarized insulating material of deposited silicon oxide having a first bonding surface, wherein said planarized insulating material is opposite said first surface, and a device layer between said first surface and said planarized insulating material;
a first material comprising silicon having a second surface and a second bonding surface opposite said second surface, wherein no devices are disposed in said first material;
wherein said first bonding surface is an etched surface terminated with nitrogen;
wherein said first and second bonding surfaces are in direct contact with each other and bonded together with a chemical bond without any adhesive;
wherein said device layer comprises CMOS circuitry and includes at least one insulating layer;
wherein said first surface is one surface of a thinned silicon substrate;
wherein said first surface includes a photolithographic mask on at least a portion thereof; and
wherein said etched surface has a RMS surface roughness of between abut 0.1 and 3.0 nm.

31. A bonded structure, comprising:
a first silicon material comprising a first surface and a planarized insulating material having a first bonding surface wherein said planarized insulating material is opposite said first surface;
a second material having a second surface and a second bonding surface opposite said second surface, wherein no devices are disposed in said second material;
wherein said first bonding surface is an etched surface terminated with a species; and
wherein said first and second bonding surfaces are in direct contact with each other and bonded together with a chemical bond without any adhesive.

32. The structure as recited in claim 31, wherein at least one device is contained within said first silicon material.

33. The structure as recited in claim 31, wherein at least one integrated circuit is contained within said first silicon material.

34. The structure as recited in claim 33, wherein said at least one integrated circuit is a CMOS integrated circuit.

35. The structure as recited in claim 31, wherein said planarized insulating material is a deposited silicon oxide.

36. The structure as recited in claim 31, wherein said species comprises nitrogen.

37. The structure as recited in claim 31, wherein said second material comprises silicon.

38. The structure as recited in claim 31, wherein said first surface is one surface of a thinned silicon substrate.

39. The structure as recited in claim 38, wherein said thinned silicon substrate has a thickness of about 10 mils to 10 microns.

40. The structure as recited in claim 38, wherein said thinned surface includes a photolithographic mask on at least a portion thereof.

41. The structure as recited in claim 31, wherein said chemical bond has a strength of at least 1000 mJ/m$^2$.

42. The structure as recited in claim 41, wherein said chemical bond has a strength of at least 2000 mJ/m$^2$.

43. The structure as recited in claim 31, wherein said species is a fluorine-containing species.

44. The structure as recited in claim 31, wherein said species is a nitrogen-based species.

45. The structure as recited in claim 44, wherein said planarized insulating material comprises silicon oxide.

46. The structure as recited in claim 31, wherein said second bonding surface of said second material comprises an etched surface.

47. The structure as recited in claim 46, wherein said first surface is one surface of a thinned silicon substrate.

48. The structure as recited in claim 31, wherein said etched surface has a RMS surface roughness of between about 0.1 and 3.0 nm.

49. The structure as recited in claim 48, wherein said RMS surface roughness is between about 0.5 and 1.0 nm.

50. The structure as recited in claim 48, wherein said RMS surface roughness between about 0.1 and 0.5 nm RMS.

51. The structure as recited in claim 31, wherein said second surface comprises an oxide layer.

52. The structure as recited in claim 51, wherein said oxide layer is a native oxide layer.

53. The structure as recited in claim 51, wherein said oxide layer is a formed oxide layer.

54. The structure as recited in claim 51, wherein said oxide layer is about 5 nm thick.

55. The structure as recited in claim 31, wherein said first silicon material further comprises a device layer between said first surface and said planarized insulating material.

56. The structure as recited in claim 55, wherein said device layer comprises one or more layers.

57. The structure as recited in claim 56, wherein said device layer comprises at least two layers.

58. The structure as recited in claim 57, wherein said device layer comprises processed integrated circuitry and at least one insulating layer.

59. The structure as recited in claim 58, wherein said processed integrated circuitry is CMOS integrated circuitry.

60. A bonded structure, comprising:
a first silicon material comprising a first surface having a thickness, a planarized insulating material of deposited silicon oxide having a first bonding surface, wherein said planarized insulating material is opposite said first surface, and a device layer between said first surface and said planarized insulating material;
a second material comprising silicon having a second surface and a second bonding surface opposite said second surface, wherein no devices are disposed in said second material;
wherein said first bonding surface is an etched surface terminated with nitrogen;
wherein said first and second bonding surfaces are in direct contact with each other and bonded together with a chemical bond without any adhesive;
wherein said device layer comprises CMOS circuitry and includes at least one insulating layer;
wherein said first surface is one surface of a thinned silicon substrate;
wherein said first surface includes a photolithographic mask on at least a portion thereof; and
wherein said etched surface has a RMS surface roughness of between abut 0.1 and 3.0 nm.

* * * * *